(12) United States Patent
Mizuno

(10) Patent No.: US 8,557,716 B2
(45) Date of Patent: Oct. 15, 2013

(54) SEMICONDUCTOR DEVICE MANUFACTURING METHOD AND SUBSTRATE PROCESSING APPARATUS

(75) Inventor: Norikazu Mizuno, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 758 days.

(21) Appl. No.: 12/707,008

(22) Filed: Feb. 17, 2010

(65) Prior Publication Data

US 2010/0210118 A1  Aug. 19, 2010

(30) Foreign Application Priority Data

Feb. 17, 2009  (JP) .................................. 2009-034256
Jan. 18, 2010  (JP) .................................. 2010-007961

(51) Int. Cl.
*H01L 21/31* (2006.01)

(52) U.S. Cl.
USPC ..... 438/770; 438/787; 438/791; 257/E21.271

(58) Field of Classification Search
USPC .......................... 438/770, 773, 775, 787, 791; 257/E21.271
See application file for complete search history.

(56) References Cited

U.S. PATENT DOCUMENTS

| 6,090,442 | A | 7/2000 | Klaus |
| 6,818,250 | B2 * | 11/2004 | George et al. ............. 427/255.15 |
| 7,858,535 | B2 * | 12/2010 | Surthi ............................ 438/787 |
| 7,964,441 | B2 * | 6/2011 | Joe et al. ......................... 438/99 |

FOREIGN PATENT DOCUMENTS

| JP | 2004040110 | 2/2004 |
| JP | 2006-066587 | 3/2006 |
| JP | 2007142415 | 6/2007 |
| JP | 2008141191 | 6/2008 |
| KR | 20040005568 | 1/2004 |
| KR | 20050064243 | 6/2005 |

* cited by examiner

*Primary Examiner* — Michael Trinh
(74) *Attorney, Agent, or Firm* — Brundidge & Stanger, P.C.

(57) ABSTRACT

A thin film can be formed on a substrate at a low temperature with a practicable film-forming rate. There is provided a semiconductor device manufacturing method for forming an oxide or nitride film on a substrate. The method comprises: exposing the substrate to a source gas; exposing the substrate to a modification gas comprising an oxidizing gas or a nitriding gas, wherein an atom has electronegativity different from that of another atom in molecules of the oxidizing gas or the nitriding gas; and exposing the substrate to a catalyst. The catalyst has acid dissociation constant $pK_a$ in a range from 5 to 7, but a pyridine is not used as the catalyst.

5 Claims, 15 Drawing Sheets

|  | AMMONIA | METHYLAMINE | TRIMETHYLAMINE | TRIMETHYLAMINE |
|---|---|---|---|---|
|  | H-N(H)(H)(H) | (CH3)-N(H)(H) | (C2H5)-N(C2H5)(C2H5) | (CH3)-N(CH3)(CH3) |
| ACID ASSOCIATION CONSTANT (Pka) | 9.2 | 10.6 | 10.75 | 9.8 |

Fig. 20

|  | PYRROLIDINE | PIPERIDINE |
|---|---|---|
|  | C4H9N | C5H11N |
|  |  |  |
| ACID DISSOCIATION CONSTANT (PKa) | 11.4 | 11.2 |

Fig. 21

|  | PYRAZINE | TRIAZINE |
|---|---|---|
|  | C4H4N2 | C3H3N3 |
|  |  |  |
| ACID DISSOCIATION CONSTANT (PKa) | 0.95 | 0.4 | under 35 U.S.C. §119 of Japanese Patent Application No.
SEMICONDUCTOR DEVICE MANUFACTURING METHOD AND SUBSTRATE PROCESSING APPARATUS

CROSS-REFERENCE TO RELATED PATENT APPLICATION

This U.S. non-provisional patent application claims priority under 35 U.S.C. §119 of Japanese Patent Application No. 2009-034256, filed on Feb. 17, 2009, and Japanese Patent Application No. 2010-007961, filed on Jan. 18, 2010, in the Japanese Patent Office, the entire contents of which are hereby incorporated by reference.

BACKGROUND OF THE INVENTION

1. Field of the Invention

The present invention relates to a semiconductor device manufacturing method and a substrate processing apparatus, and more particularly, to technology for processing a substrate at a low temperature.

2. Description of the Prior Art

A film can be formed on a substrate by a method such as a chemical vapor deposition (CVD) method in which a plurality of kinds of sources including a plurality of constitutional elements of a film are simultaneously supplied to a substrate placed in a process chamber; and an atomic layer deposition (ALD) method in which a plurality of kinds of sources are alternately supplied to a substrate (for example, refer to Patent Document 1).

However, in such a method, a film may have to be formed at a high temperature of about 700° C. for obtaining a practical film growing rate; however, high-temperature processing increases the possibility of impurity rediffusion, and thus low-temperature processing has been required.

[Patent Document 1]
Japanese Unexamined Patent Application Publication No. 9006-66587

As means for low temperature processing, use of catalysts can be considered. Since a catalyst reduces the activation energy of a source gas applied to a substrate, the process temperature can be reduced. Examples of film forming methods using a catalyst include U.S. Pat. No. 6,090,442, Japanese Patent Application Publication No. 2004-40110, and Japanese Patent Application Publication No. 2008-141191. The example patents disclose exemplary methods of using pyridine ($C_5H_5N$) as a catalyst; however, since pyridine causes environmental pollution such as air pollution, use of pyridine is regulated by a law.

SUMMARY OF THE INVENTION

An object of the present invention is to provide a semiconductor device manufacturing method and a substrate processing apparatus by which a film can be formed on a substrate at a low temperature.

According to an aspect of the present invention, there is provided a semiconductor device manufacturing method for forming an oxide or nitride film on a substrate, the semiconductor device manufacturing method comprising: exposing the substrate to a source gas; exposing the substrate to a modification gas comprising an oxidizing gas or a nitriding gas, wherein an atom has electronegativity different from that of another atom in molecules of the oxidizing gas or the nitriding gas; and exposing the substrate to a catalyst, wherein the catalyst has acid dissociation constant $pK_a$ in a range from 5 to 7, but a pyridine is not used as the catalyst.

According to another aspect of the present invention, there is provided a semiconductor device manufacturing method comprising: exposing a substrate placed in a process chamber to a source gas; stopping an exposure of the substrate to the source gas and purging the source gas; exposing the substrate to a catalyst and a modification gas comprising an oxidizing gas or a nitriding gas, wherein an atom has electronegativity different from that of another atom in molecules of the oxidizing gas or the nitriding gas; and stopping an exposure of the substrate to the catalyst and the modification gas, and purging the catalyst and the modification gas, wherein the exposure of the substrate to the source gas and the exposure of the substrate to the catalyst and the modifications gas are performed while heating the substrate so as to form an oxide or nitride film on the substrate, and wherein the process chamber is kept at a pressure lower than a vapor pressure of a byproduct corresponding to a surface temperature of the substrate during the exposure of the substrate to the catalyst and modification gas, the byproduct being produced by a reaction between the catalyst and the source gas and starting to sublimate at the vapor pressure.

According to another aspect of the present invention, there is provided a substrate processing apparatus comprising: a process chamber configured to accommodate a substrate; a first gas supply system configured to supply a source gas to the process chamber; a second gas supply system configured to supply at least one of an oxidizing gas and a nitriding gas to the process chamber, wherein an atom has electronegativity different from that of another atom in molecules of the oxidizing gas and the nitriding gas; a third gas supply system configured to supply a catalyst to the process chamber, wherein the catalyst has acid dissociation constant $pK_a$ in a range from about 5 to about 7 but a pyridine is not used as the catalyst; and a control unit configured to control the first to third gas supply systems, wherein the control unit controls the first to third gas supply systems to expose a surface of the substrate to a mixture of the source gas and the catalyst and then to a mixture of the catalyst and at least one of the oxidizing gas and the nitriding gas, so as to form a oxide or nitride film on the substrate.

BRIEF DESCRIPTION OF THE DRAWINGS

FIG. 20 is a view illustrating structures of catalysts having high $pK_a$.

FIG. 21 is a view illustrating structure of catalysts having low $pK_a$.

DETAILED DESCRIPTION OF THE PREFERRED EMBODIMENTS

Although many kinds of catalysts can be used, the inventers have selected catalysts according to the acid dissociation constant ($pK_a$) of the catalysts which is a quantitative index indicating the strength of an acid. Although a dissociation reaction by which hydrogen ions are generated from an acid can be expressed by an equilibrium constant $K_a$ or the negative common logarithm of $K_a$ ($pK_a = -\log_{10} K_a$), only the negative common logarithm $pK_a$ is used herein for consistency. An acid having a low $pK_a$ is a strong acid.

For example, $NH_3$ can be used as a catalyst. $NH_3$ can be used as a catalyst because a nitrogen (N) atom of a $NH_3$ molecule has a lone pair of electrons that attracts a hydrogen (H) atom. The degree of a force attracting hydrogen can be expressed by acid dissociation constant ($pK_a$), and the $pK_a$ of $NH_3$ is about 11. High $pK_a$ indicates a strong hydrogen (H) attracting force.

The present invention is provided based on the knowledge of the inventors. Hereinafter, a first embodiment of the present invention, which is an embodiment of the present invention, will be described with respect to the attached drawings.

[Overall Structure of Apparatus]

In the current embodiment of the present invention, a substrate processing apparatus of the present invention is configured as an example of a semiconductor manufacturing apparatus that performs a processing process in a method of manufacturing a semiconductor device integrated circuit (IC). In the following description, the use of a vertical apparatus, which is configured to perform a processing process on a substrate such as an oxidation process, a diffusion process, or a chemical vapor deposition (CVD) process, will be described as an example of a substrate processing apparatus.

Figure 1:
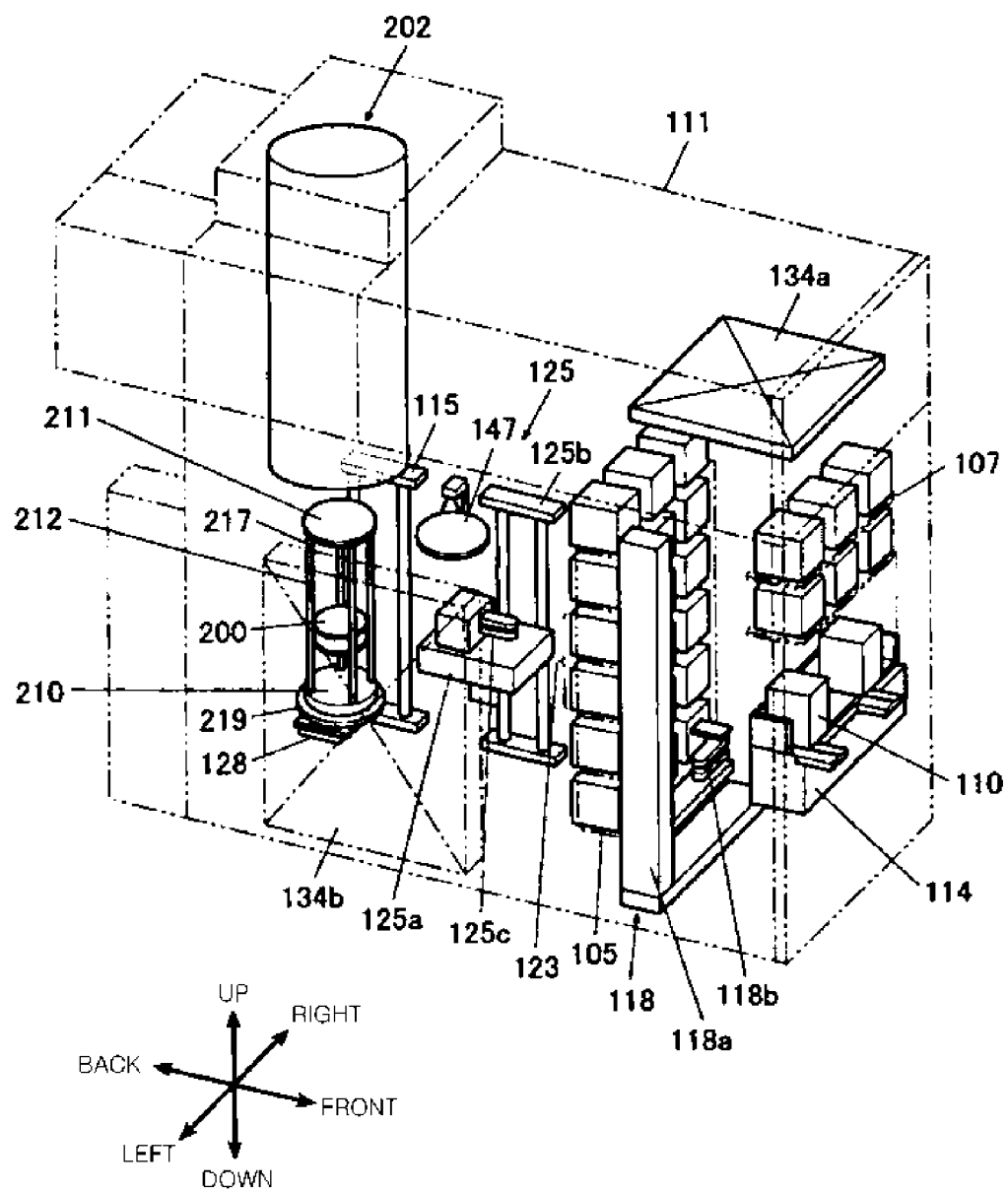
FIG. 1 is a schematic perspective view illustrating a substrate processing apparatus that can be properly used according to an embodiment of the present invention.

FIG. 1 is a schematic perspective view illustrating a substrate processing apparatus that can be properly used according to an embodiment of the present invention. However, the present invention is not limited to the substrate processing apparatus of the current embodiment. For example, the present invention can be applied to other substrate processing apparatuses such as a substrate processing apparatus having a single-wafer type, hot wall type, or cold wall type process furnace As shown in FIG. 1, in a substrate processing apparatus 101, cassettes 110 are used to accommodate substrates such as wafers 200, and the wafers 200 may be silicon wafers. The substrate processing apparatus 101 includes a case 111, in which a cassette stage 114 is installed. The cassettes 110 are designed to be carried onto the cassette stage 114, or carried away from the cassette stage 114, by an in-process carrying unit (not shown).

On the cassette stage 114, a cassette 110 is placed by an in-process carrying device in a manner such that wafers 200 are vertically positioned in the cassette 110 and a wafer hole of the cassette 110 is pointed upward. The cassette stage 114 is configured so that the cassette 110 is rotated 90° counter-clockwise in a longitudinal direction to the backward of the case 111 so as to horizontally orient the wafers 200 of the cassette 110 and point the wafer hole of the cassette 110 to the backward of the case 111.

Near the center part of the case 111 in a front-to-back direction, a cassette shelf 105 is installed. The cassette shelf 105 is configured so that a plurality of cassettes 110 can be stored in multiple rows and columns.

At the cassette shelf 105, a transfer shelf 123 is installed to store cassettes 110, which are carrying objects of a wafer transfer mechanism 125.

At the upside of the cassette stage 114, a standby cassette shelf 107 is installed, and configured to store standby cassettes 110.

Between the cassette stage 114 and the cassette shelf 105, a cassette carrying device 118 is installed. The cassette carrying device 118 includes a cassette elevator 118a capable of moving upward and downward while holding a cassette 110, and a cassette carrying mechanism 118b. The cassette carrying device 118 is configured to carry cassettes 110 among the cassette stage 114, the cassette shelf 105, and the standby cassette shelf 107 by continuous motions of the cassette elevator 118a and the cassette carrying mechanism 118b.

At the backside of the cassette shelf 105, the wafer transfer mechanism 125 is installed. The wafer transfer mechanism 125 includes a wafer transfer device 125a capable of rotating or linearly moving wafers 200 in a horizontal direction, and a wafer transfer unit elevator 125b configured to move the wafer transfer device 125a upward and downward. At the wafer transfer device 125a, tweezers 125c are installed to pick up wafers 200. The wafer transfer mechanism 125 is configured to pick up wafers 200 using the tweezers 125c, and charge the wafers 200 into a boat 217 or discharge the wafer 200 from the boat 217, by continuous motions of the wafer transfer device 125a and the wafer transfer unit elevator 125b.

At the upside of the rear part of the case 111, a process furnace 202 is installed to perform a heat treatment process on wafers 200, and the bottom side of the process furnace 202 is configured to be opened and closed by a furnace port shutter 147.

At the downside of the process furnace 202, a boat elevator 115 is installed to move the boat 217 upward to and downward from the process furnace 202. An arm 128 is connected to an elevating table of the boat elevator 115, and a seal cap 219 is horizontally attached to the arm 128. The seal cap 219 supports the boat 217 vertically, and is configured be seal the bottom side of the process furnace 202.

The boat 217 includes a plurality of holding members, and is configured to hold a plurality of wafers 200 (for example, about fifty to one hundred fifty wafers) horizontally in a state that the wafers 200 are vertically arranged with the centers of the wafers 200 being aligned.

At the upside of the cassette shelf 105, a cleaning system 134a is installed to supply clean air as purified atmosphere. The cleaning system 134a includes a supply fan and a dust filter to supply clean air to the inside of the case 111.

At the left side end part of the case 111, another cleaning system 134b is installed to supply clean air. The cleaning system 134b includes a supply fan and a dust filter to supply clean air to the surrounding area of the wafer transfer device 125a, the boat 217, or the like. After flowing around the wafer transfer device 125a, the boat 217 or the like, clean air is exhausted to the outside of the case 111.

Next, a main operation of the substrate processing apparatus 101 will be described.

A cassette 110 carried to the cassette stage 114 by the in-plant carrying unit (not shown) is placed on the cassette stage 114 in a state where wafers 200 inside the cassette 110 are vertically positioned and the wafer hole of the cassette 110 is pointed upward. Thereafter, the cassette 110 is rotated counterclockwise by 90° in a longitudinal direction toward the backward of the case 111 by the cassette stage 114 so that the wafers 200 inside the cassette 110 are horizontally positioned and the wafer hole of the cassette 110 is pointed to the backward of the case 111.

Then, the cassette 110 is automatically carried and placed by the cassette carrying device 118 to a specified shelf position of the cassette shelf 105 or the standby cassette shelf 107 so as to be temporarily stored, and is then transferred to the transfer shelf 123 from the cassette shelf 105 or the standby cassette shelf 107 by the cassette carrying device 118. Alternatively, the carry cassette 110 may be directly transferred to the transfer shelf 123 from the cassette stage 114.

After the cassette 110 is transferred to the transfer shelf 123, wafers 200 are picked up from the cassette 110 through the wafer hole of the cassette 110 and are charged into the boat 217 by the tweezers 125c of the wafer transfer device 125a. After delivering the wafer 200 to the boat 217, the wafer transfer device 125a returns to the cassette 110 so as to charge the next wafers 200 into the boat 217.

After a predetermined number of wafers 200 are charged into the boat 217, the bottom side of the process furnace 202 closed by the furnace port shutter 147 is opened by moving the furnace shutter 147. Subsequently, the boat 217 holding a group of wafers 200 is loaded into the process furnace 202 by an ascending motion of the boat elevator 115, and the bottom side of the process furnace 202 is closed by the seal cap 219.

After the loading, a predetermined heat treatment process is performed on the wafers 200 charged in the process furnace 202. Thereafter, the wafers 200 and the cassette 110 are carried to the outside of the case 111 in a reverse sequence of the above.

[Structure of Process Furnace]

Figure 2:
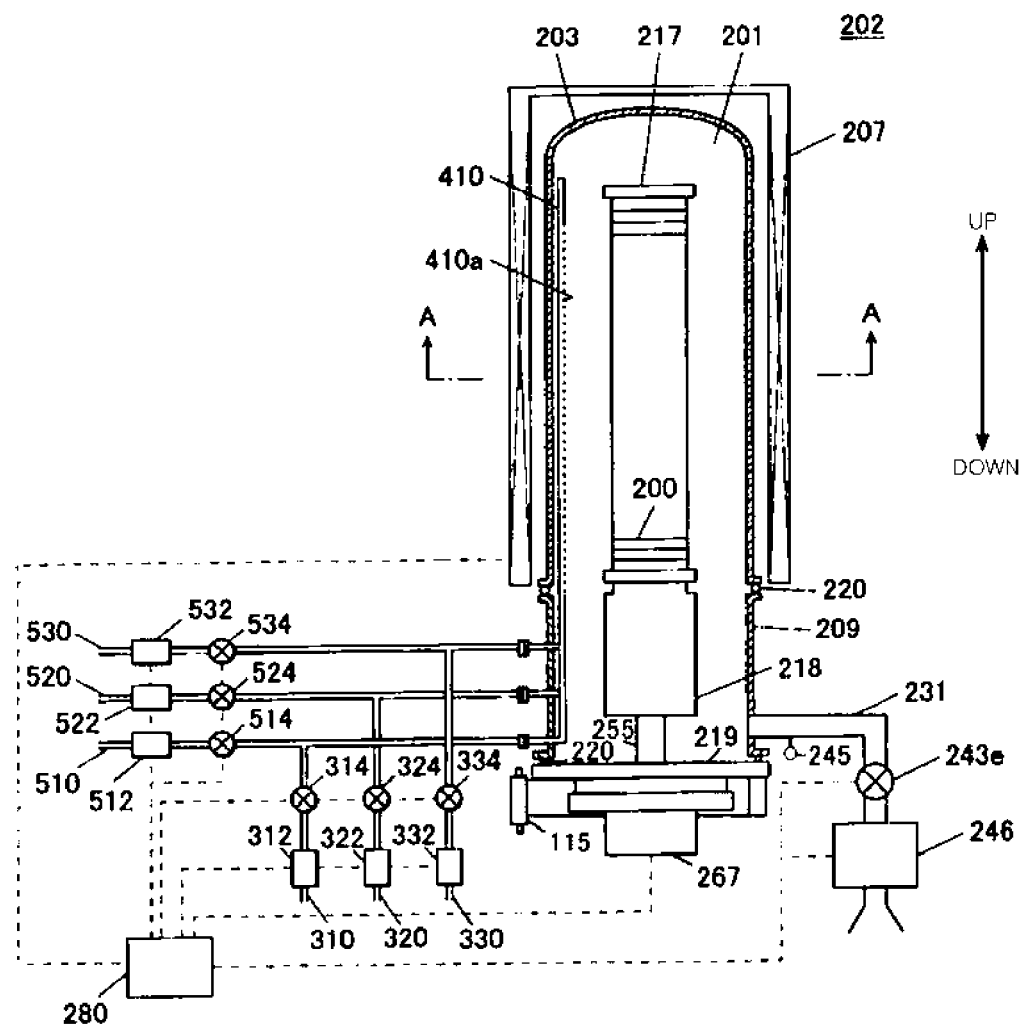
FIG. 2 is a schematic view illustrating a process furnace and surrounding members that can be properly used according to an embodiment of the present invention, in which a vertical section of the process furnace is illustrated.
Figure 3:
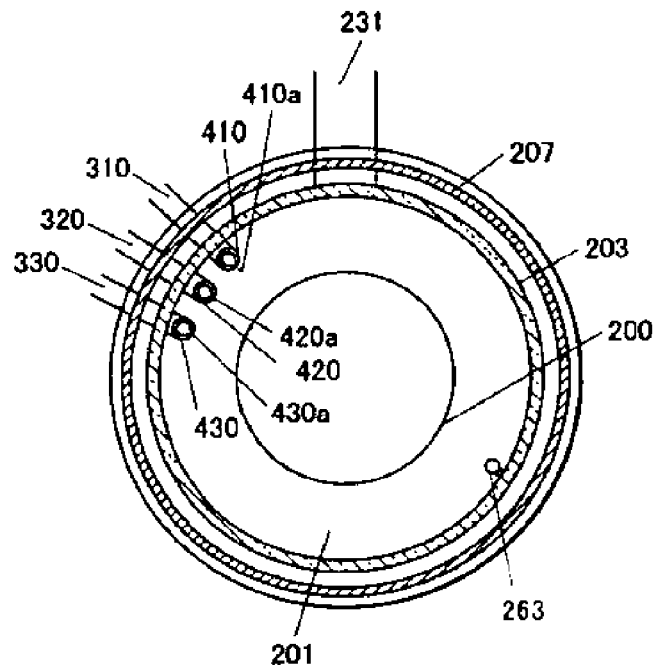
FIG. 3 is a sectional view taken along line A-A of the process furnace of FIG. 2 that can be properly used according to an embodiment of the present invention.

Next, the structure of the process furnace 202 will be described. FIG. 2 is a schematic view illustrating an example of the process furnace 202 and surrounding members that can be properly used according to an embodiment of the present invention, in which a vertical section of the process furnace 202 is illustrated. FIG. 3 is a sectional view taken along line A-A of the process furnace 202 of FIG. 2.

As shown in FIG. 2 and FIG. 3, at the process furnace 202, a heater 207 is installed to heat wafers 200. The heater 207 includes an insulating member having a cylindrical shape with a closed top side, and a plurality of heating wires installed with reference to the insulating member to form a heating system structure.

Inside the heater 207, a reaction tube 203 is installed to process wafers 200.

At the lower end of the reaction tube 203, a manifold 209 made of a material such as stainless steel is installed in a manner such that an O-ring 220 is disposed therebetween as a sealing member. A lower end opening of the manifold 209 is tightly sealed by a cap such as the seal cap 219 with an O-ring 220 being disposed between the manifold 209 and the seal cap 219. The seal cap 219 is made of a metal such as stainless steel and has a disk shape. In the process furnace 202, a process chamber 201 is formed at least by the reaction tube 203, the manifold 209, and the seal cap 219.

At the seal cap 219, a boat support 218 is installed to support the boat 217. The boat support 218 is made of a heat-resistant material such as quartz or silicon carbide. The boat support 218 functions as an insulator as well as a supporting body that supports the boat 217. As shown in FIG. 1, the boat 217 includes a bottom plate 210 fixed to the boat support 218, a top plate 211 disposed at the stop side of the boat 217, and a plurality of pillars 212 installed between the bottom plate 210 and the top plate 211. In the boat 217, a plurality of wafers 200 are held. The plurality of wafers 200 are supported by the pillars 212 of the boat 217 in a state where the wafers 200 are arranged at regular intervals and horizontally oriented.

At the above-described process furnace 202, in a state where a plurality of wafers 200 to be batch-processed are piled in multiple states inside the boat 217, the boat 217 is inserted into the process chamber 201 while being supported by the boat support 218, and then the heater 207 heats the wafers 200 inserted in the process chamber 201 to a predetermined temperature.

As shown in FIG. 2 and FIG. 3, two source gas supply pipes 310 and 320, and a catalyst supply pipe 330 are connected to the process chamber 201.

At the source gas supply pipe 310, a mass flow controller 312 and a valve 314 are installed. A nozzle 410 is connected to the leading end of the source gas supply pipe 310. The nozzle 410 is installed through the manifold 209 constituting the process chamber 201, and in an arc-shaped space between the inner wall of the reaction tube 203 and wafers 200, the nozzle 410 extends vertically along the inner wall of the reaction tube 203. A plurality of gas supply holes 410a are formed in the lateral side of the nozzle 410 to supply a source gas through the gas supply holes 410a. The sizes of the gas supply holes 410a are equal or varied from the lower side to the upper side, and the gas supply holes 410a are arranged at the same pitch. In addition, a carrier gas supply pipe 510 is connected to the source gas supply pipe 310 to supply a carrier gas. At the carrier gas supply pipe 510, a mass flow controller 512 and a valve 514 are installed. A first source gas supply system is formed mainly by the source gas supply pipe 310, the mass flow controller 312, the valve 314, and the nozzle 410.

In addition, a first carrier gas supply system is formed mainly by the carrier gas supply pipe 510, the mass flow controller 512, and the valve 514.

At the source gas supply pipe 320, a mass flow controller 322 and a valve 324 are installed. A nozzle 420 is connected to the leading end of the source gas supply pipe 320. Like the nozzle 410, the nozzle 420 is installed through the manifold 209 constituting the process chamber 201, and in the arc-shaped space between the inner wall of the reaction tube 203 and the wafers 200, the nozzle 420 extends vertically along the inner wall of the reaction tube 203. A plurality of gas supply holes 420a are formed in the lateral side of the nozzle 420 to supply a source gas through the gas supply holes 420a. Like the gas supply holes 410a, the sizes of the gas supply holes 420a are equal or varied from the lower side to the upper side, and the gas supply holes 420a are arranged at the same pitch. In addition, a carrier gas supply pipe 520 is connected to the source gas supply pipe 320 to supply a carrier gas. At the carrier gas supply pipe 520, a mass flow controller 522 and a valve 524 are installed. A second source gas supply system is formed mainly by the source gas supply pipe 320, the mass flow controller 322, the valve 324, and the nozzle 420. In addition, a second carrier gas supply system is formed mainly by the carrier gas supply pipe 520, the mass flow controller 522, and the valve 524.

At the catalyst supply pipe 330, a mass flow controller 332 and a valve 334 are installed. A nozzle 430 is connected to the leading end of the catalyst supply pipe 330. Like the nozzle 410, the nozzle 430 is installed through the manifold 209 constituting the process chamber 201, and in the arc-shaped space between the inner wall of the reaction tube 203 and the wafers 200, the nozzle 430 extends vertically along the inner wall of the reaction tube 203. A plurality of catalyst supply holes 430a are formed in the lateral side of the nozzle 430 to supply a catalyst through the catalyst supply holes 430a. Like the gas supply holes 410a, the sizes of the catalyst supply holes 430a are equal or varied from the lower side to the upper side, and the catalyst supply holes 430a are arranged at the same pitch. A carrier gas supply pipe 530 is connected to the catalyst supply pipe 330 to supply a carrier gas. At the carrier gas supply pipe 530, a mass flow controller 532 and a valve 534 are installed. A catalyst supply system is formed mainly by the catalyst supply pipe 330, the mass flow controller 332, the valve 334, and the nozzle 430. In addition, a third carrier gas supply system is formed mainly by the carrier gas supply pipe 530, the mass flow controller 532, and the valve 534.

In the above-described structure, for example, a silicon (Si) source (such as TCS: trichloro silane ($SiHCl_4$) or HCD: hexachloro disilane ($Si_2Cl_6$)) is introduced into the source gas supply pipe 310 as an example of a metal source gas. For example, an oxidizing gas such as $H_2O$ or $H_2O_2$ is introduced into the source gas supply pipe 320. A catalyst such as $NH_3$ is introduced into the catalyst supply pipe 330.

An exhaust pipe 231 is connected to the process chamber 201 to exhaust the inside atmosphere of the processing chamber 201. A vacuum exhaust device such as a vacuum pump 246 is connected to the process chamber 201, and a pressure detector (pressure detecting unit) such as a pressure sensor 245 configured to detect the inside pressure of the process chamber 201 and a pressure regulator (pressure regulating unit) such as an auto pressure controller (APC) valve 243e are disposed between the process chamber 201 and the vacuum pump 246, so that the inside of the process chamber 201 can be evacuated to a predetermined pressure (vacuum degree). The APC value 243e is an on/off value, which is configured to be opened and closed for starting and stopping evacuation of the processing chamber 201 and be adjusted in opening size for controlling the inside pressure of the process chamber 201. An exhaust system is formed mainly by the exhaust pipe 231, the APC valve 243e, the vacuum pump 246, and the pressure sensor 245.

At the center part inside the reaction tube 203, the boat 217 is installed. The boat 217 is configured to be lifted into and lowered away from the reaction tube 203 by the boat elevator 115. At the bottom side of the boat support 218 on which the boat 217 is supported, a boat rotating mechanism 267 is installed to rotate the boat 217 for improving processing uniformity. A rotation shaft 255 of the boat rotating mechanism 267 is connected to the boat 217 through the seal cap 219 so that the boat 217 supported by the boat support 218 can be rotated by operating the boat rotating mechanism 267 so as to rotate wafers 200 charged in the boat 217.

In the reaction tube 203, a temperature detector such as a temperature sensor 263 is installed, and by controlling power supplied to the heater 207 based on temperature information detected by the temperature sensor 263, desired temperature distribution can be obtained in the process chamber 201. Like the nozzles 410, 420, and 430, the temperature sensor 263 has an L-shape and is disposed along the inner wall of the reaction tube 203.

A controller 280 is connected to the above-described members such as the mass flow controllers 312, 322, 332, 512, 522, and 532, the valves 314, 324, 334, 514, 524, and 534, the APC valve 243e, the heater 207, the temperature sensor 263, the pressure sensor 245, the vacuum pump 246, the boat rotating mechanism 267, and the boat elevator 115. For example, the controller 280 is a control unit that controls the overall operation of the substrate processing apparatus 101. The controller 280 is configured to control operations such as flowrate adjusting operations of the mass flow controllers 312, 322, 332, 512, 522, and 532; opening and closing operations of the valves 314, 324, 334, 514, 524, and 534; opening, closing, and pressure adjusting operations of the APC valve 243e; a temperature adjusting operation of the heater 207; operations of the temperature sensor 263 and the pressure sensor 245; start and stop operations of the vacuum pump 246; a rotation speed adjusting operation of the boat rotating mechanism 267; an elevating operation of the boat elevator 115.

[Method of Manufacturing Semiconductor Device]

Next, an explanation will be given on a method of forming an insulating film on a substrate by using the process furnace 202 of the substrate processing apparatus 101 in a semiconductor device manufacturing process such as a large scale integration (LSI) circuit manufacturing process.

In the following description, operations of parts of the substrate processing apparatus 101 are controlled by the controller 280.

In the current embodiment, an explanation will be given on an exemplary method of forming a film on a substrate by an atomic layer deposition (ALD) method. In the ALD method which is a kind of chemical vapor deposition (CVD) method, process gases including at least two kinds of materials constituting a film are alternately supplied to a substrate under predetermined film formation conditions (temperature, time, etc.), and the process gases are adsorbed on the substrate on an atomic layer basis to form a film by a surface reaction. In this time, the thickness of the film is controlled by adjusting the number of process gas supply cycles (for example, if the film-forming rate is 1 Å/cycle and it is intended to form a 20-Å film, the process is repeated for twenty cycles).

First Embodiment

Figure 4:
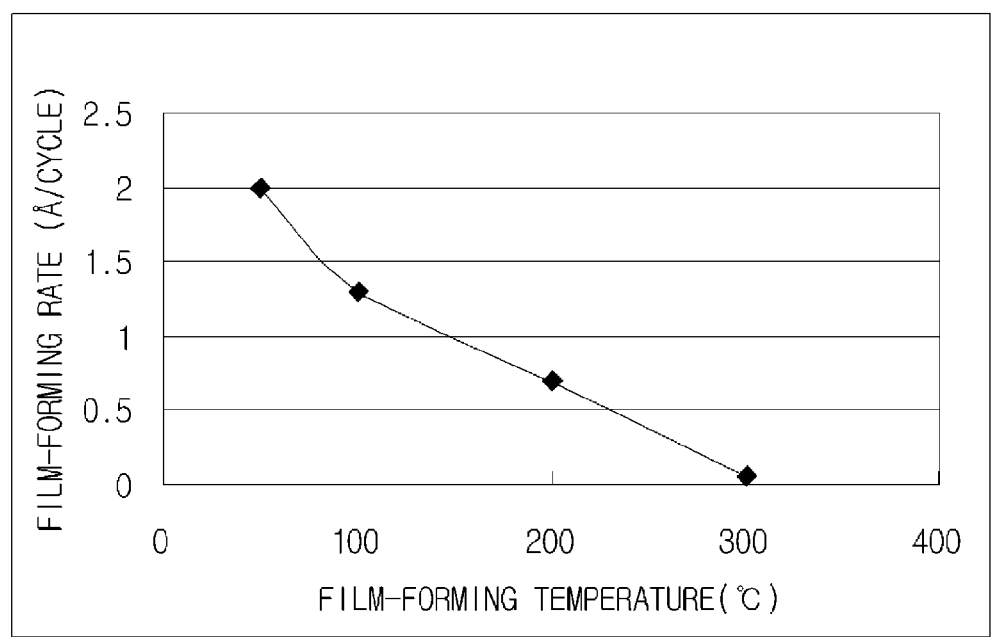
FIG. 4 is a view illustrating a relationship between film-forming rate and film-forming temperature when a silicon film is formed using $NH_3$ as a catalyst.

In the current embodiment, an explanation will be given on an example of forming a silicon oxide film on a substrate as an insulating film by using trichloro silane ($SiCl_4$) as a silicon-containing gas, water ($H_2O$) as an oxidizing gas, and ammonia ($NH_3$) as a catalyst. $NH_3$ is used as a catalyst because a nitrogen (N) atom of a $NH_3$ molecule has a lone pair of electrons that attracts hydrogen (H). The degree of a force attracting hydrogen is expressed by an acid dissociation constant ($pK_a$), and $NH_3$ has a $pK_a$ of about 11. A large $pK_a$ means a strong hydrogen attracting force, and $NH_3$ has such characteristics. FIG. 4 is a view illustrating a relationship between film-forming rate and film-forming temperature when a silicon film is formed using $NH_3$ as a catalyst. In FIG. 4, the film-forming temperature means the inside temperature of the process chamber 201. As shown in FIG. 4, a film can be formed at a temperature of about 200° C. or lower, and the film-forming rate increases as the film-forming temperature decreases.

Figure 5:
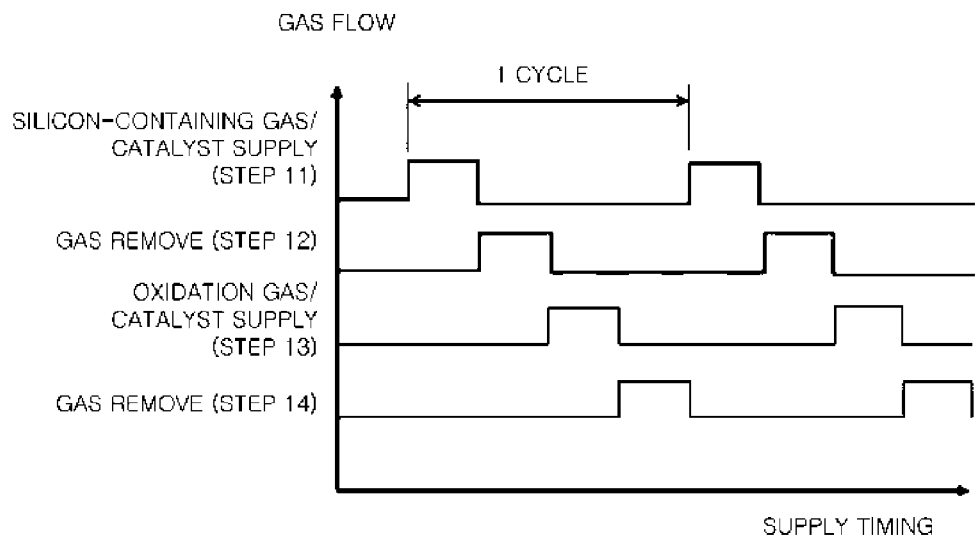
FIG. 5 is a view illustrating a sequence for forming a silicon oxide film according to a first embodiment of the present invention.
Figure 6A:
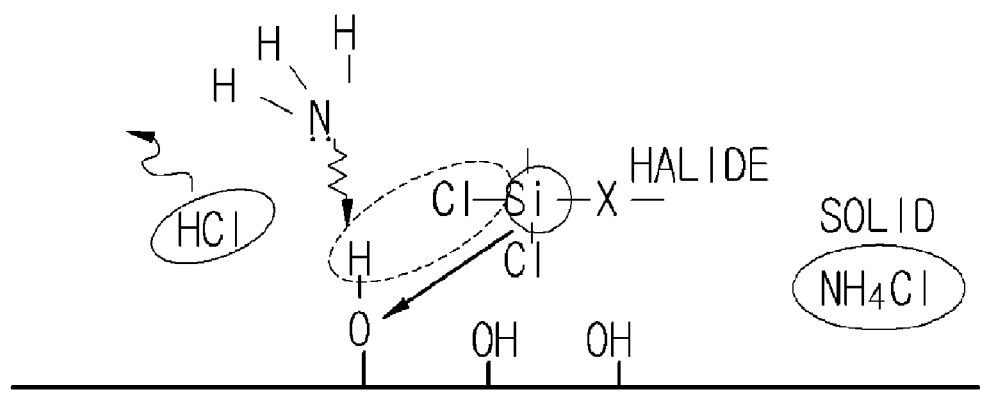
FIG. 6A and FIG. 6B are views illustrating models of silicon oxide film formation according to the first embodiment of the present invention.
Figure 6B:
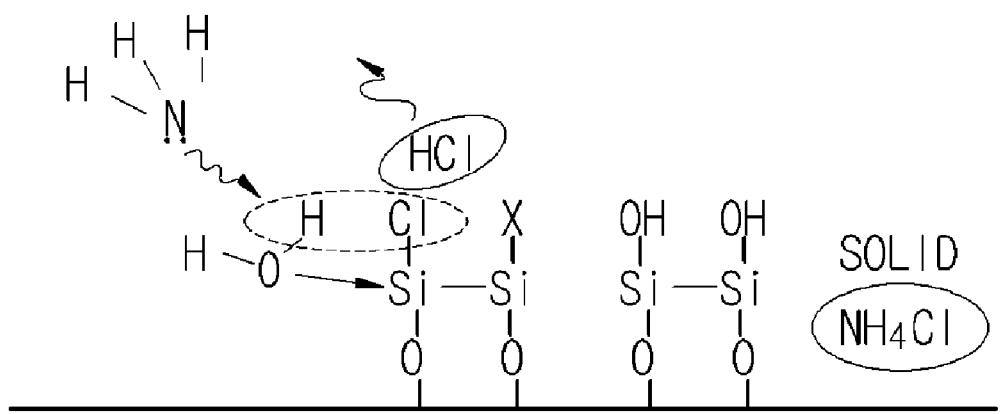
Figure 7:
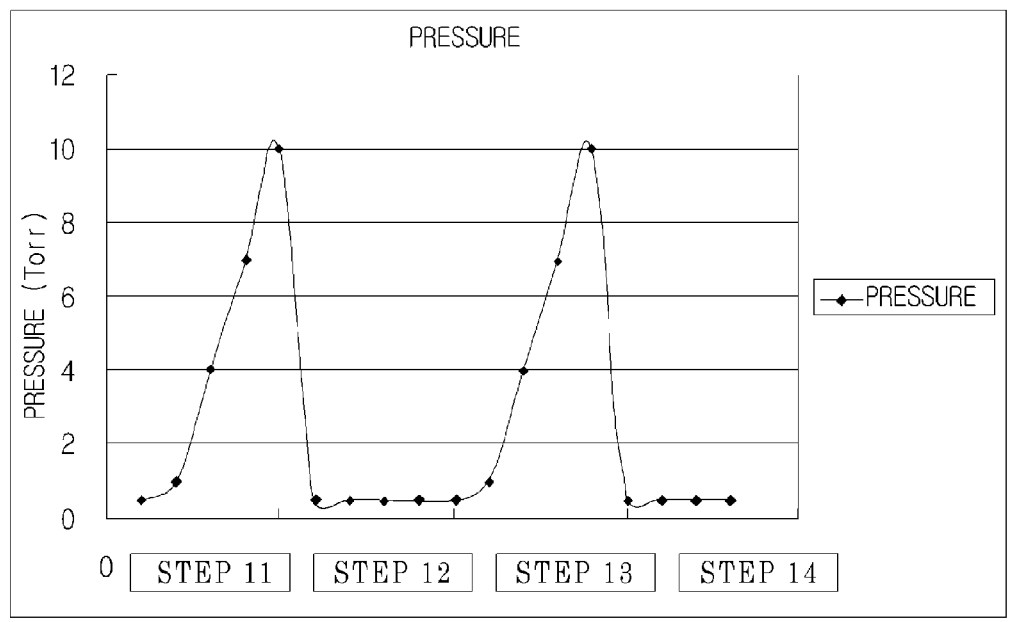
FIG. 7 is a view illustrating pressure variations in the film forming sequence of the first embodiment of present invention.

FIG. 5 is a view illustrating a sequence for forming a silicon oxide film using $NH_3$ as a catalyst, and FIG. 6A and FIG. 6B are views illustrating models of silicon oxide film formation when $NH_3$ is used as a catalyst. FIG. 7 is a view illustrating pressure variations in the process chamber 201 during a film-forming process. Hereinafter, with reference to FIG. 5, FIG. 6A, and FIG. 6B, a film-forming method will be described in detail according to the current embodiment.

In a film-forming process, the controller 280 controls the substrate processing apparatus 101 as follows. The controller 280 controls the heater 207 to keep the inside temperature of the process chamber 201, for example, in the range from room temperature to 200° C., preferably from room temperature to 150° C., more preferably at 100° C. Then, a plurality of wafers 200 are charged into the boat 217, and the boat 217 is loaded into the process chamber 201.

Thereafter, the boat 217 is rotated by the boat rotating mechanism 267 to rotate the wafers 200. Then, the vacuum pump 246 is operated and the APC valve 243e is opened to evacuate the inside of the process chamber 201, and if the temperature of the wafers 200 reaches 100° C. and processing conditions become stable, the following four steps are sequentially performed while maintaining the inside temperature of the process chamber 201 at 100° C.

(Step 11)

In a state where $SiCl_4$ is introduced into the source gas supply pipe 310, $H_2O$ is introduced into the source gas supply pipe 320, a $NH_3$ catalyst is introduced into the catalyst supply pipe 330, and $N_2$ is introduced into the carrier gas supply pipes 510, 520, and 530, the valves 314, 334, 514, 524, and 534 are properly opened. However, the valve 324 is not opened.

As a result, as shown in FIG. 5, $SiCl_4$ is mixed with $N_2$ and flows to the nozzle 410 from the source gas supply pipe 310, and is supplied to the process chamber 201 through the gas supply holes 410a. In addition, a $NH_3$ catalyst is mixed with $N_2$ and flows to the nozzle 430 from the catalyst supply pipe 330, and is supplied to the process chamber 201 through the catalyst supply holes 430a. In addition, $N_2$ flows to the nozzle 420 from the carrier gas supply pipe 520, and is supplied to the process chamber 201 through the gas supply holes 420a. Inside the process chamber 201, the $SiCl_4$ and $NH_3$ catalyst flow along the surfaces of the wafers 200 and are exhausted through the gas exhaust pipe 231.

In step 11, the valves 314 and 334 are controlled to supply $SiCl_4$ and $NH_3$ catalyst for 1 second to 100 seconds, preferably, 5 seconds to 30 seconds. In addition, the valves 314 and 334 are controlled to keep constant the flowrate ratio (volume flowrate ratio) of $SiCl_4$ and $NH_3$ catalyst. For example, the flowrate ratio of $SiCl_4$ (sccm)/$NH_3$ (sccm) is kept at 0.01 to 100, preferably at 0.05 to 10. At the same time, the APC valve 243e is properly controlled to adjust the inside pressure of the process chamber 201 to an optimal value in a predetermined range (for example, 10 Torr in FIG. 7).

As described above, in step 11, $SiCl_4$ and $NH_3$ catalyst are supplied to the inside of the process chamber 201 to cause $NH_3$ catalyst to act on OH bonds adsorbed on the silicon (Si) substrate (wafer 200) for extracting hydrogen (H) as shown in FIG. 6A. That is, OH bonds are weakened, and thus Cl of $SiCl_4$ reacts with H to produce HCl gas (released) and form a halide adsorbed on the Si substrate.

(Step 12)

The valves 314 and 334 are closed to interrupt supply of $SiCl_4$ and $NH_3$ catalyst but the carrier gas supply pipes 510, 520, and 530 are not closed to supply $N_2$ gas continuously to the inside of the process chamber 201 for purging the process chamber 201 with $N_2$. The purging is carried out for 15 seconds, for example. Alternatively, purging and vacuum evacuation may be performed within 15 seconds. As a result, remaining $SiCl_4$ and $NH_3$ catalyst are removed from the process chamber 201.

(Step 13)

In a state where the valves 514, 524, and 534 are opened, the valves 324 and 334 are properly opened. The valve 314 is closed. Then, as shown in FIG. 5, $H_2O$ is mixed with $N_2$ and flows to the nozzle 420 from the source gas supply pipe 320, and is supplied to the process chamber 201 through the gas supply holes 420a. In addition, a $NH_3$ catalyst is mixed with $N_2$ and flows to the nozzle 430 from the catalyst supply pipe 330, and is supplied to the process chamber 201 through the catalyst supply holes 430a.

In addition, $N_2$ flows to the nozzle 410 from the carrier gas supply pipe 510, and is supplied to the process chamber 201 through the gas supply holes 410a. Inside the process chamber 201, the $H_2O$ and $NH_3$ catalyst flow along the surfaces of the wafers 200 and are exhausted through the gas exhaust pipe 231.

In step 13, the valves 324 and 334 are controlled to supply $H_2O$ and $NH_3$ catalyst for 1 second to 100 seconds, preferably, 5 seconds to 30 seconds. In addition, the valves 324 and 334 are controlled to keep constant the flowrate ratio (volume flowrate ratio) of $H_2O$ and $NH_3$ catalyst. For example, the flowrate ratio of $H_2O$ (sccm)/$NH_3$ (sccm) is kept at 0.01 to 100, preferably at 0.05 to 10. At the same time, the APC valve 243e is properly controlled to adjust the inside pressure of the process chamber 201 to an optimal value in a predetermined range (for example, 10 Torr in FIG. 7).

As described above, in step 13, $H_2O$ and $NH_3$ catalyst are supplied to the inside of the process chamber 201 to cause $NH_3$ catalyst to act on OH bonds of $H_2O$ as shown in FIG. 6B. Similarly, as OH bonds are weakened, the OH bonds react with chlorine (Cl) adsorbed on the Si substrate (wafer 200) to produce HCl (released), and O is adsorbed. Here, preferably, it may be controlled to maintain the weight percent of $H_2O$ similar to the weight percent of $NH_3$ catalyst.

(Step 14)

The valves 324 and 334 are closed to interrupt supply of $H_2O$ and $NH_3$ catalyst but the carrier gas supply pipes 510, 520, and 530 are not closed to supply $N_2$ gas continuously to the inside of the process chamber 201 for purging the process chamber 201 with $N_2$. The purging is carried out for 15 seconds, for example. Alternatively, purging and vacuum evacuation may be performed within 15 seconds. As a result, remaining $H_2O$ and $NH_3$ catalyst are removed from the process chamber 201.

Thereafter, steps 11 to step 14 are repeated for a plurality of cycles to form silicon oxide films on the wafers 200 to a predetermined thickness. In each cycle, it is necessary to perform the process in a manner such that the atmosphere of step 11 formed by a silicon-containing gas and a catalyst is not mixed with the atmosphere of step 13 formed by an oxidizing gas and a catalyst in the process chamber 201. In this way, silicon oxide films are formed on the wafers 200.

Thereafter, the process chamber 201 is vacuum-evacuated to exhaust remaining $SiCl_4$, $H_2O$, and $NH_3$ catalyst; the inside pressure of the process chamber 201 is adjusted to atmospheric pressure by controlling the APC valve 243e; and the boat 217 is unloaded from the process chamber 201. In this way, the film-forming process (batch process) is performed one time.

In the above description, $SiCl_4$ is used as a silicon-containing gas (metal-containing gas); however, other sources gases may be used. Examples of sources gases that can be used as a silicon-containing gas include: chlorine (Cl)-based source gases such as hexachlorodisilane (HCD: $Si_2Cl_6$), trichlorosilane (TCS: $SiHCl_3$), trisdimethylaminosilane (TDMAS: $SiH(N(CH_3)_2)_3$), dichlorosilane (DCS: $SiH_2Cl_2$), octachlorotrisilane ($Si_3Cl_8$), trichloromethylsilane (($CH_3)SiCl_3$); fluorine (F)-based source gases such as $SiF_4$ and $Si_2F_6$; $SiI_4$; and $SiBr_4$. That is, a silicon-containing fluoride, a silicon-containing bromide, or a silicon-containing iodide may also be used as a silicon-containing gas. However, a compound containing chlorine and an alkyl group such as $SiCl_3(CH_3)$ may not be suitable because the film-forming rate can be decreased by steric hinderance caused by the alkyl group. Compounds such as chlorides, fluorides, bromides, and iodides may be preferable, and a silicon compound to which hydrogen (H) is partially coupled may be more preferable. For example, $SiH_2Cl_2$ may be more preferable. A metal-containing substance having a double bond such as $Si_2Cl_2$ may also be used.

In addition, $H_2O$ is used as an oxidizing gas; however, other oxidizing gases may be used. Such oxidizing gases are required to have electric polarity which is presented by an atom having electronegativity different from that of another element in a molecule. The reason for this requirement is that a catalyst acts on electrically polar molecules to reduce the activation energy of a source gas. Therefore, for example, $H_2O$ or $H_2O_2$ having an OH bond, $H_2+O_2$ mixture plasma, or $H_2+O_3$ may be used as an oxidizing gas. However, non-polar molecules such as $O_2$ or $O_3$ are not suitable.

Figures 8, 9:
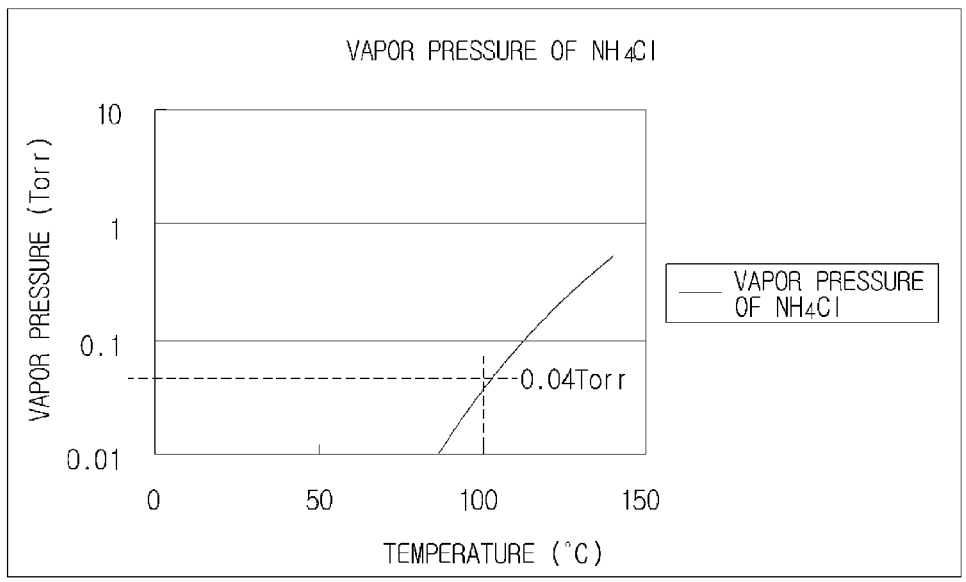
FIG. 8 is a view illustrating structures of $NH_3$ and catalysts having $pK_a$ similar to that of $NH_3$.
FIG. 9 is a view illustrating a vapor pressure curve of $NH_4Cl$.

$NH_3$ is used as a catalyst; however, other gases can be used. For example, trimethylamine ($N(CH_3)_3$, $pK_a$=9.8), methylamine ($H_2N(CH_3)$, $pK_a$=10.6), or triethylamine ($N(C_2H_5)_3$, $pK_a$=10.7) may be used. FIG. 8 shows structures of such substances. The acid dissociation constant $pK_a$ of the substances range from 9.8 to 10.7, and the acid dissociation constant $pK_a$, of $NH_3$ is about 9.2.

As described above, a film can be formed at a low temperature by using $NH_3$ catalyst; however, since $SiCl_4$ is supplied together with the $NH_3$ catalyst as shown in FIG. 6A, the $NH_3$ catalyst itself can react with Cl of $SiCl_4$ to produce $NH_4Cl$ as a reaction byproduct. Such a byproduct may become particles and undesirably affect a semiconductor device manufacturing process.

Although trimethylamine ($N(CH_3)_3$, $pK_a$=9.8), methylamine ($H_2N(CH_3)$, $pK_a$=10.6), or triethylamine ($N(C_2H_5)_3$, $pK_a$=10.7) is used instead of $NH_3$, generation of particles cannot be reduced. This is caused by a low vapor pressure of $NH_4Cl$.

FIG. 9 is a view illustrating a vapor pressure curve of $NH_4Cl$. Generally, $NH_4Cl$ is in a gaseous (vapor) state at a pressure lower than its vapor pressure. That is, $NH_4Cl$ particles do not exit. In addition, $NH_4Cl$ is in a solid state at a pressure higher than its vapor pressure. That is, $NH_4Cl$ particles exist. Here, solid may mean particles.

Meanwhile, as shown in FIG. 7, in steps 11 to 13, the inside pressure of the process chamber 201 increases up to 10 Torr, and the inside temperature of the process chamber 201 ranges from room temperature to 200° C., preferable at 100° C. At 100° C., the vapor pressure of $NH_4Cl$ is 5 Pa (0.04 Torr) lower than the film-forming pressure of 10 Torr, so that $NH_4Cl$ is adsorbed as solid. Undesirably, such solid may generate particles.

As described above, use of $NH_3$ as a catalyst makes it possible to form a film at a low temperature; however, in this case, it is required to prevent generation of particles.

Next, an explanation will be given on a method of forming a film at a low temperature by using a catalyst generating fewer particles to overcome limitations of the first embodiment.

Second Embodiment

It is necessary to prevent direct reaction between Cl (chlorine) and a catalyst for suppressing generation of particles. Generally, a substance having high acid dissociation constant tends to actively react with a substance including a group 17 element such as chlorine (Cl). Therefore, to suppress generation of particles, it is necessary to select a substance having low acid dissociation constant. For example, pyridine ($C_5H_5N$, $pK_a$=5.7) is selected. In addition, $SiCl_4$ (trichlorosilane) is used as a silicon-containing gas, and $H_2O$ (wafer) is used as an oxidizing gas. This exemplary case will now be described.

Furthermore, generation of particles can be reduced by setting the inside pressure of the process chamber 201 to a level lower than the vapor pressure of a byproduct generating after a film-forming process. However, if the inside pressure of the process chamber 201 is excessively low, the film-forming rate may be reduced to lower throughput. Therefore, preferably, a catalyst is selected on the basis that a byproduct generating after a film-forming process has a sufficiently high vapor pressure so as not to affect the throughput.

Figure 10:
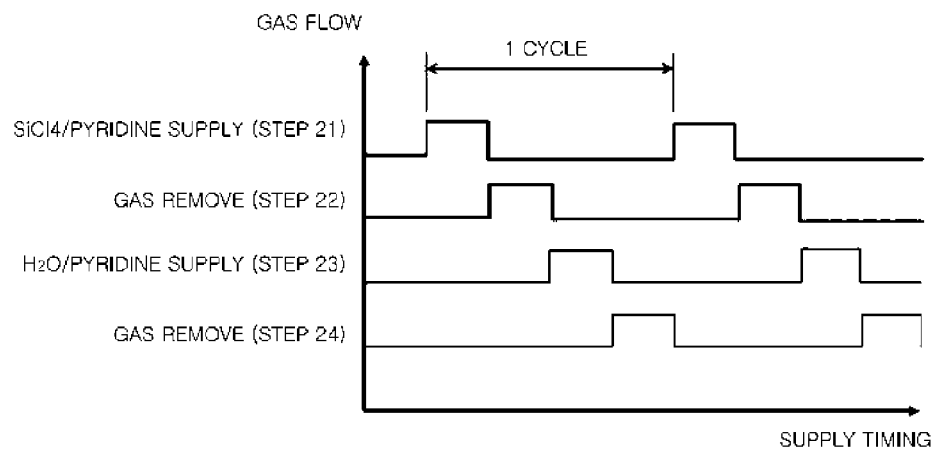
FIG. 10 is a view illustrating a sequence for forming a silicon oxide film according to a second embodiment of the present invention.
Figure 15:
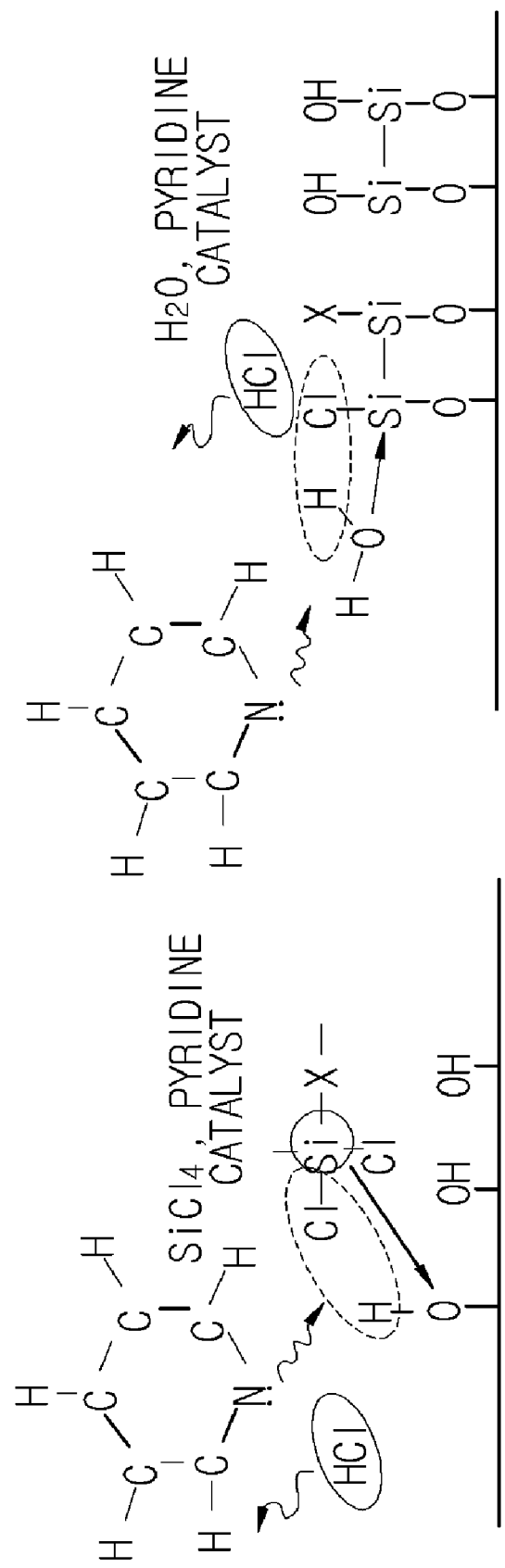
FIG. 15 is a view illustrating models of silicon oxide film formation according to the second embodiment of the present invention.

FIG. 10 is a view illustrating a sequence for forming a film according to the current embodiment, and FIG. 15 is a view illustrating film-forming models when pyridine is used as a catalyst.

In a film-forming process, the controller 280 controls the substrate processing apparatus 101 as follows. The controller 280 controls the heater 207 to keep the inside temperature of the process chamber 201, for example, in the range from room temperature to 200° C., preferably from room temperature to 150° C., more preferably at 100° C. Then, a plurality of wafers 200 are charged into the boat 217, and the boat 217 is loaded into the process chamber 201. Thereafter, the boat 217 is rotated by the boat rotating mechanism 267 to rotate the wafers 200. Then, the vacuum pump 246 is operated and the APC valve 243e is opened to evacuate the inside of the process chamber 201, and if the temperature of the wafers 200 reaches 100° C. and processing conditions become stable, the following four steps are sequentially performed while maintaining the inside temperature of the process chamber 201 at 100° C.

(Step 21)

In a state where $SiCl_4$ is introduced into the source gas supply pipe 310, $H_2O$ is introduced into the source gas supply pipe 320, pyridine is introduced into the catalyst supply pipe 330, and $N_2$ is introduced into the carrier gas supply pipes 510, 520, and 530, the valves 314, 334, 514, 524, and 534 are properly opened. However, the valve 324 is not opened.

As a result, as shown in FIG. 10, $SiCl_4$ is mixed with $N_2$ and flows to the nozzle 410 from the source gas supply pipe 310, and is supplied to the process chamber 201 through the gas supply holes 410a. In addition, pyridine is mixed with $N_2$ and flows to the nozzle 430 from the catalyst supply pipe 330, and is supplied to the process chamber 201 through the catalyst supply holes 430a. In addition, $N_2$ flows to the nozzle 420 from the carrier gas supply pipe 520, and is supplied to the process chamber 201 through the gas supply holes 420a. Inside the process chamber 201, the $SiCl_4$ and pyridine flow along the surfaces of the wafers 200 and are exhausted through the gas exhaust pipe 231.

Figure 11:
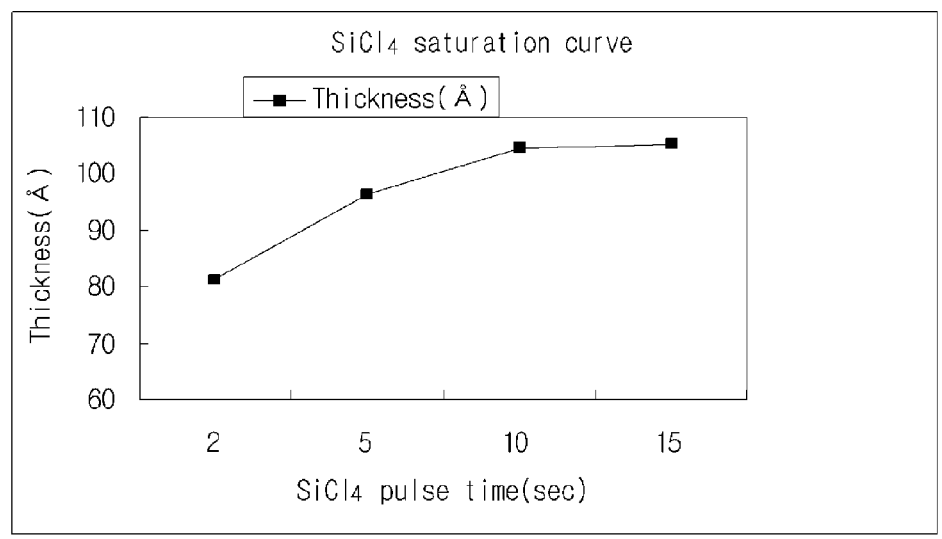
FIG. 11 is a view illustrating a relationship between supply time of $SiCl_4$ and pyridine and film thickness.

In step 21, the valves 314 and 334 are controlled to supply $SiCl_4$ and pyridine for 1 second to 100 seconds, preferably, 5 seconds to 30 seconds. Here, the relationship between supply time of $SiCl_4$ and pyridine and film thickness is shown in FIG. 11. As the supply time of $SiCl_4$ increases, the film thickness increases; however, if the supply time increases equal to or longer than 15 seconds, the film thickness is not varied. This is due to saturation of a surface adsorption reaction. That is, since the amount of source gas supplied at or after 15 seconds from the start of supply is uselessly consumed, it is not cost effective. Since the saturation time at which the surface adsorption reaction is saturated is dependent on the size of the process chamber 201 and the number of wafers 200, the saturation time can be varied from 15 seconds, and thus it may be necessary to properly adjust the supply time, for example, in the range from 5 seconds to 30 seconds.

Figure 12:
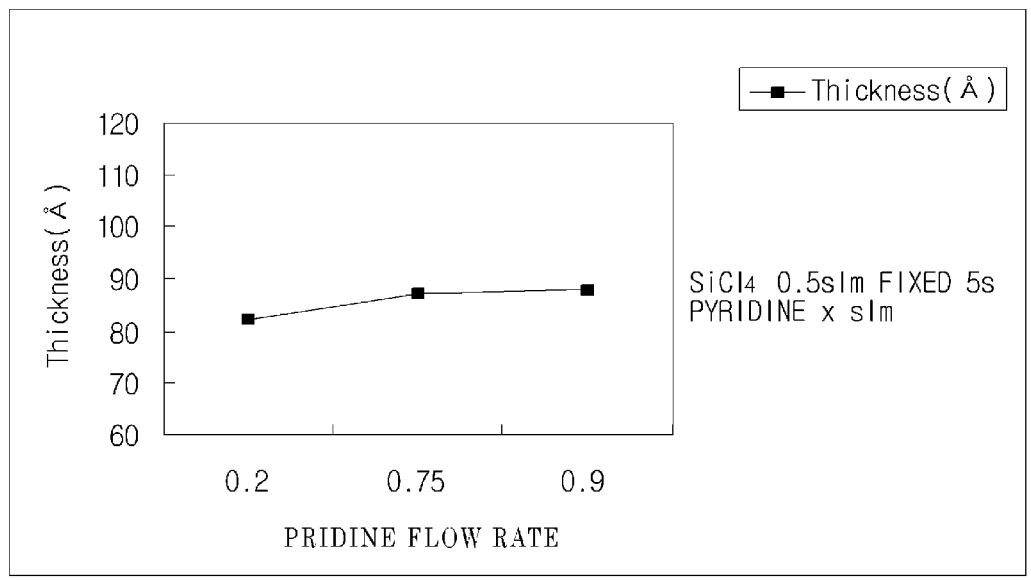
FIG. 12 is a view illustrating a film thickness obtained by supplying $SiCl_4$ at a constant rate and pyridine at a varying rate.

In addition, the valves 314 and 334 are controlled to keep constant the flowrate ratio (volume flowrate ratio) of $SiCl_4$ and pyridine. For example, the flowrate ratio of $SiCl_4$ (sccm)/pyridine (sccm) is kept at 0.01 to 100, preferably at 0.05 to 10. FIG. 12 is a view illustrating a film thickness obtained by supplying $SiCl_4$ at a constant rate of 500 sccm while supplying pyridine at a varying rate. The film thickness increases as the supply flowrate of pyridine increases; however, the supply flowrate of pyridine increases equal to or greater than 750 sccm, the film thickness is not increased. In the experiment, the flowrate ratio of $SiCl_4$/pyridine is optimal at 500/750=0.66; however, it may be properly adjusted according to the size of the process chamber 201 and the number of wafers 200, for example, in the range from 0.05 to 10. At the same time, the APC valve 243e is properly controlled to adjust the inside pressure of the process chamber 201 to an optimal value in a predetermined range (for example, 10 Torr). Here, the inside pressure of the process chamber 201 is set to a level lower than the vapor pressure of a byproduct that can be produced after a film-forming process.

As described above, $SiCl_4$ and pyridine are supplied to the inside of the process chamber 201 to cause pyridine to act on OH bonds adsorbed on the silicon (Si) substrate (wafer 200) for extracting hydrogen (H) as shown in FIG. 15. That is, OH bonds are weakened, and thus Cl of $SiCl_4$ reacts with H to produce HCl gas (released) and form a halide adsorbed on the Si substrate.

(Step 22)

The valves 314 and 334 are closed to interrupt supply of $SiCl_4$ and pyridine but the carrier gas supply pipes 510, 520, and 530 are not closed to supply $N_2$ gas continuously to the inside of the process chamber 201 for purging the process chamber 201 with $N_2$. The purging is carried out for 15 seconds, for example. Alternatively, purging and vacuum evacuation may be performed within 15 seconds. As a result, remaining $SiCl_4$ and pyridine are removed from the process chamber 201.

(Step 23)

In a state where the valves 514, 524, and 534 are opened, the valves 324 and 334 are properly opened. The valve 314 is closed. Then, as shown in FIG. 10, $H_2O$ is mixed with $N_2$ and flows to the nozzle 420 from the source gas supply pipe 320, and is supplied to the process chamber 201 through the gas supply holes 420a. In addition, pyridine is mixed with $N_2$ and flows to the nozzle 430 from the catalyst supply pipe 330, and is supplied to the process chamber 201 through the catalyst supply holes 430a. In addition, $N_2$ flows to the nozzle 410 from the carrier gas supply pipe 510, and is supplied to the process chamber 201 through the gas supply holes 410a. Inside the process chamber 201, the $H_2O$ and pyridine flow along the surfaces of the wafers 200 and are exhausted through the gas exhaust pipe 231.

Figure 13:
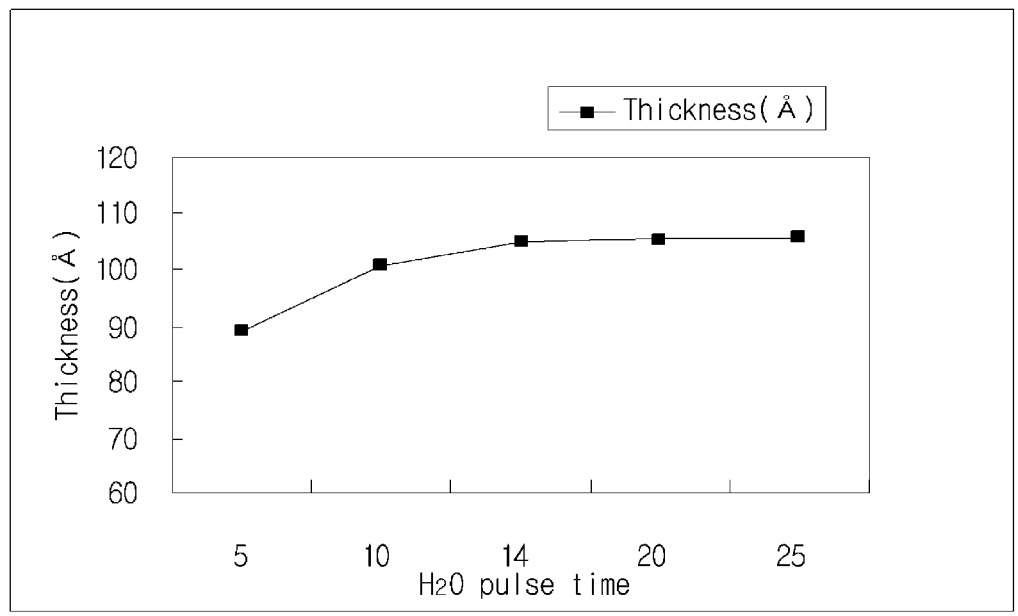
FIG. 13 is a view illustrating a relationship between supply time of $H_2O$ and pyridine and film thickness.
Figure 14:
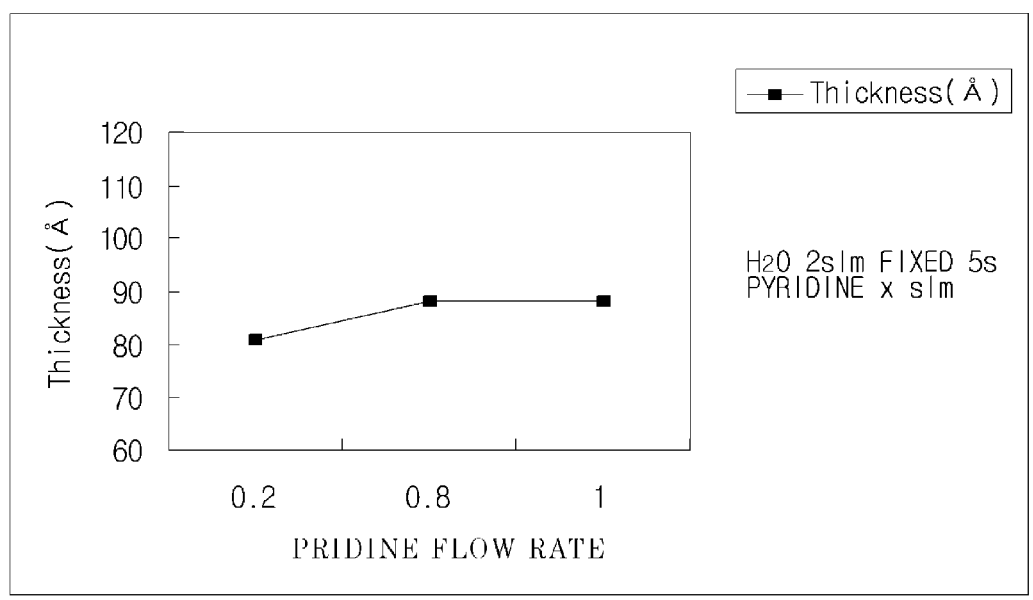
FIG. 14 is a view illustrating a film thickness obtained by supplying $H_2O$ at a constant rate and pyridine at a varying rate.

In step 23, the valves 324 and 334 are controlled to supply $H_2O$ and pyridine for 1 second to 100 seconds, preferably, 5 seconds to 30 seconds. Here, the relationship between supply time of $H_2O$ and pyridine and film thickness is shown in FIG. 13. As the supply time of $H_2O$ increases, the film thickness increases; however, if the supply time increases equal to or longer than 14 seconds, the film thickness is not varied. This is due to saturation of a surface adsorption reaction. That is, since the amount of source gas supplied at or after 14 seconds from the start of supply is uselessly consumed, it is not cost effective. Since the saturation time at which the surface adsorption reaction is saturated is dependent on the size of the process chamber 201 and the number of wafers 200, the saturation time can be varied from 14 seconds, and thus it may be necessary to properly adjust the supply time, for example, in the range from 5 seconds to 30 seconds In addition, the valves 324 and 334 are controlled to keep constant the flowrate ratio (volume flowrate ratio) of $H_2O$ and pyridine. For example, the flowrate ratio of $H_2O$ (sccm)/pyridine (sccm) is kept at 0.01 to 100, preferably at 0.05 to 10. FIG. 14 is a view illustrating a film thickness obtained by supplying $H_2O$ at a constant rate of 2000 sccm while supplying pyridine at a varying rate. The film thickness increases as the supply flowrate of pyridine increases; however, the supply flowrate of pyridine increases equal to or greater than 800 sccm, the film thickness is not increased. In the experiment, the flowrate ratio of $H_2O$/pyridine is optimal at 2000/800=2.5; however, it may be properly adjusted according to the size of the process chamber 201 and the number of wafers 200, for example, in the range from 0.05 to 10.

At the same time, the APC valve 243e is properly controlled to adjust the inside pressure of the process chamber 201 to an optimal value in a predetermined range (for example, 10 Torr). As described above, in step 23, $H_2O$ and pyridine are supplied to the inside of the process chamber 201 to cause pyridine to act on OH bonds of $H_2O$ as shown in FIG. 15. Similarly, as OH bonds are weakened, the OH bonds react with chlorine (Cl) adsorbed on the Si substrate (wafer 200) to produce HCl (released), and O is adsorbed. Here, preferably, it may be controlled to maintain the weight percent of $H_2O$ similar to the weight percent of pyridine.

(Step 24)

The valves 324 and 334 are closed to interrupt supply of $H_2O$ and pyridine but the carrier gas supply pipes 510, 520, and 530 are not closed to supply $N_2$ gas continuously to the inside of the process chamber 201 for purging the process chamber 201 with $N_2$. The purging is carried out for 15 seconds, for example. Alternatively, purging and vacuum evacuation may be performed within 15 seconds. As a result, remaining $H_2O$ and pyridine are removed from the process chamber 201.

Thereafter, steps 21 to step 24 are repeated for a plurality of cycles to form silicon oxide films on the wafers 200 to a predetermined thickness. In each cycle, it is necessary to perform the process in a manner such that the atmosphere of step 21 formed by a silicon-containing gas and a catalyst is not mixed with the atmosphere of step 23 formed by an oxidizing gas and a catalyst in the process chamber 201. In this way, silicon oxide films are formed on the wafers 200.

After silicon oxide films are formed on the wafers 200 to a predetermined thickness, the inside pressure of the process chamber 201 is adjusted to atmospheric pressure by controlling the APC valve 243e, and the boat 217 is unloaded from the process chamber 201. In this way, the film-forming process (batch process) is performed one time.

In the above description, $SiCl_4$ is used as a silicon-containing gas, and $H_2O$ is used as an oxidizing gas; however, other source gases and other oxidizing gases may be used as described in the first embodiment.

Figure 16:
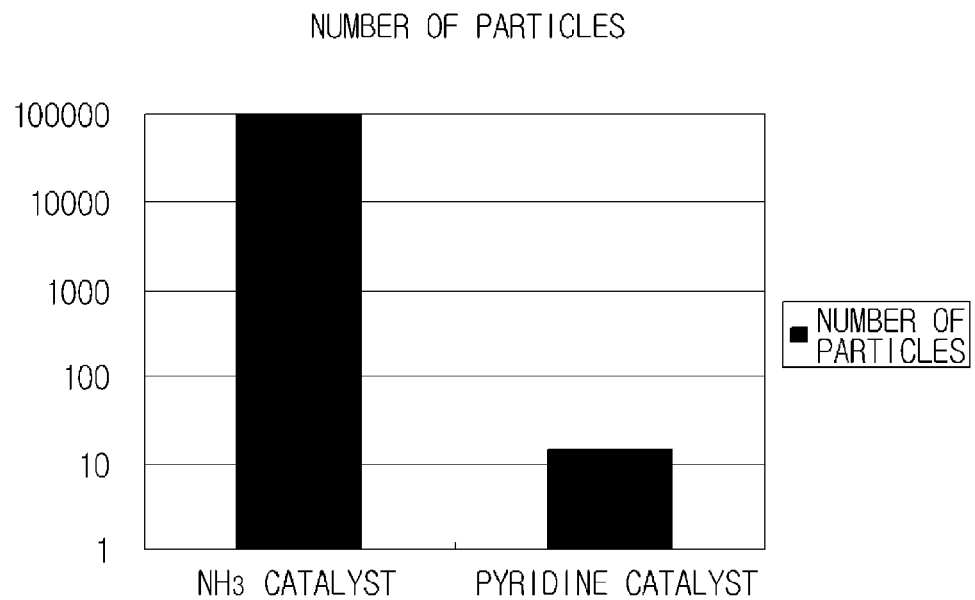
FIG. 16 is a view for comparing numbers of particles on a wafer.

FIG. 16 is a view showing numbers of particles on a wafer 200 for the case where $NH_3$ is used as a catalyst and the case where pyridine is used as a catalyst. In both cases, the process temperature of the film-forming sequence is kept at 100° C. Referring to FIG. 16, when pyridine is used as a catalyst, the number of particles can be reduced.

Figure 17:
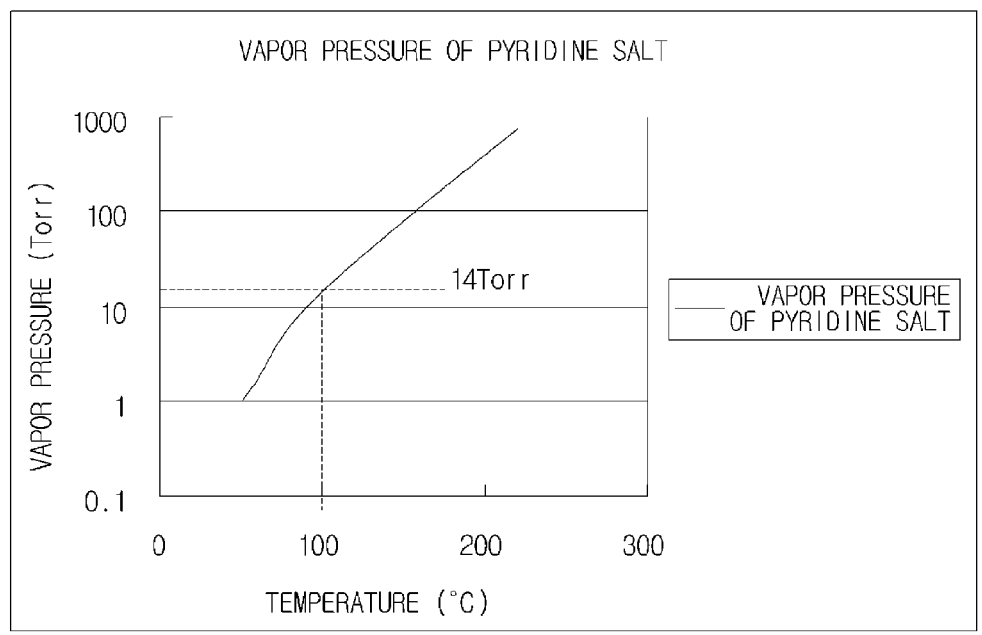
FIG. 17 is a view illustrating a vapor pressure curve of a pyridine salt.

In the case where pyridine is used as a catalyst, it is considered that particles are generated from a solidified pyridine salt (reaction byproduct). FIG. 17 is a view illustrating a vapor pressure curve of a pyridine salt. At 100° C., the vapor pressure of the pyridine salt is 14 Torr which is higher than the film-forming pressure. A reaction byproduct having a vapor pressure higher than the film-forming pressure may not be disadvantageously treated as a source of particles. If a wafer on which pyridine salt particles are formed is heat-treated at 10 Torr and 100° C., the pyridine salt particles may sublimate, and thus the particles may be reduced.

Thus, preferably, a catalyst of which a byproduct has a vapor pressure of 10 Torr or higher at 100° C. may be selected.

Figures 18, 19:
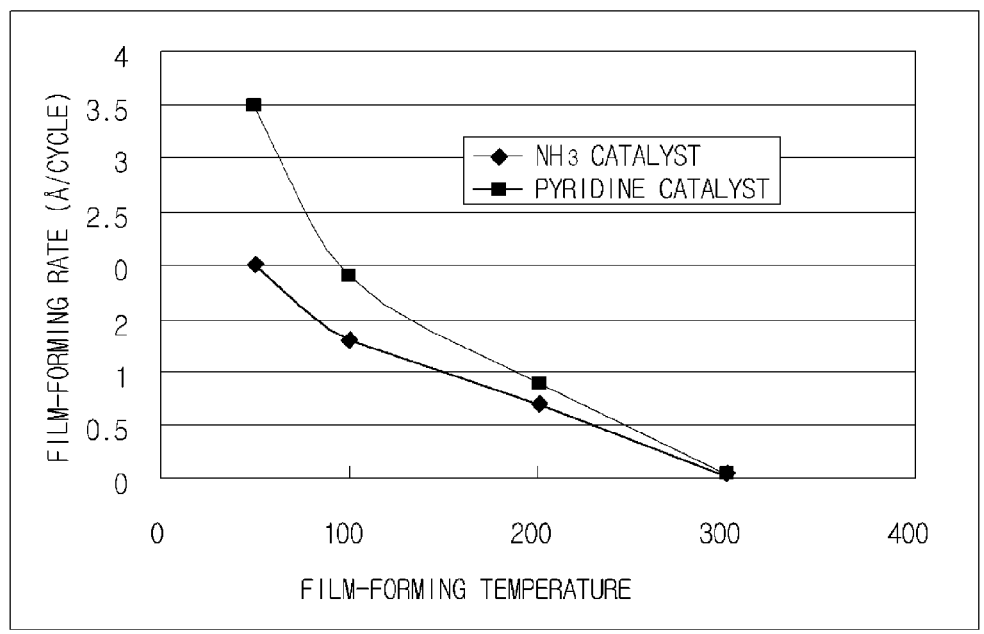
FIG. 18 is a view for comparing film-forming rates.
FIG. 19 is a view illustrating structures of catalysts having $pK_a$ in the range from 5 to 7.

FIG. 18 is a view illustrating the growing rates of oxide films for the case where $NH_3$ is used as a catalyst and the case where pyridine is used as a catalyst. Referring to FIG. 18, a film can be formed more rapidly in the case where pyridine is used as a catalyst than in the case where $NH_3$ is used as a catalyst. The reason for this may be that $NH_4Cl$, which a solid byproduct hindering a reaction, does not exist on the surface of a wafer 200.

As described above, by using pyridine having acid dissociation constant $pK_a$ smaller than that of $NH_3$ as a catalyst, a film can be formed at a low temperature, and moreover, generation of particles can be prevented.

Third Embodiment

In the second embodiment, pyridine is used as a catalyst. However, since pyridine causes environmental pollution such as air pollution, the use of pyridine may be regulated by a law or be reported. A substance such as picoline has acid dissociation constant $pK_a$ similar to that of pyridine by less regulated by a law. Except for the used of a different kind of catalyst, the current embodiment is the same as the second embodiment, and thus a detailed description of the current embodiment will be omitted.

Another catalyst having acid dissociation constant $pK_a$ of about 5 to about 7 may be used. For example, catalysts such as pyridine, aminopyridine, picoline, piperazine, and lutidine can be used. Such substances have similar structures characterized by nitrogen (N) coupled to a heterocyclic ring. FIG. 19 illustrates structures of such substances.

Although substances such as pyrrolidine and piperidine are similar to the above-described substances, since they have acid dissociation constant $pK_a$ of about 11 and easily produce chlorides, there are not preferable. FIG. 20 illustrates structures of pyrrolidine and piperidine.

In addition, although there are other similar substances such as pyrazine and triazine, since the acid dissociation constant $pK_a$ thereof is too small at about 1 which means a weak hydrogen (H) attracting force, they are not suitable for being used in a silicon oxide film forming process. FIG. 21 illustrates structures of pyrazine and triazine.

As described above, in an environment where a process chamber is kept at a low temperature and a film-forming pressure of about 10 Torr so as to prevent damage of a substrate, the inventors have found that a catalyst having acid dissociation constant $pK_a$ greater than 7 is not suitable for suppressing generation of a byproduct such as a chloride.

In addition, the inventors have found that if the acid dissociation constant $pK_a$ of a catalyst is smaller than 5, since a hydrogen (H) attracting force of the catalyst is weak, the catalyst is not suitable for forming a silicon oxide film.

As described above, by selecting a catalyst having acid dissociation constant $pK_a$ in an allowable range, a film can be formed at a low temperature while preventing generation of particles.

Fourth Embodiment

Figure 22:
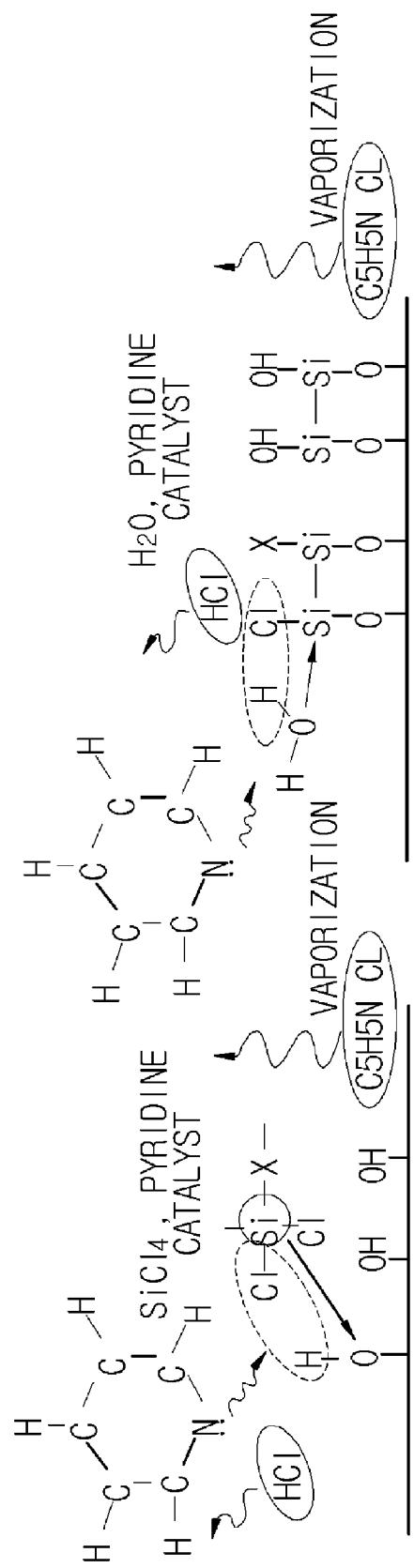
FIG. 22 is a view illustrating models of silicon oxide film formation according to a fourth embodiment of the present invention.
Figure 23:
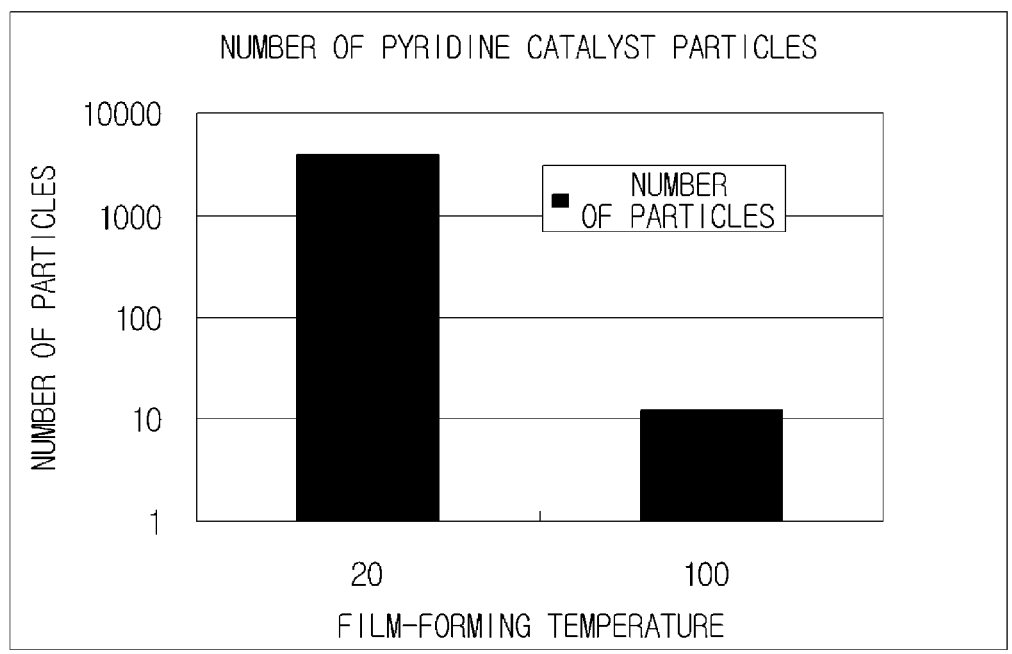
FIG. 23 is a view illustrating a relationship between particle number and film-forming temperature when pyridine is used as a catalyst.

An explanation will now be given on the case where a process temperature is set to 20° C. with other conditions being the same as those in the second embodiment. Since other conditions are the same as those of the second embodiment except for the process temperature, a detailed description of the current embodiment will be omitted. FIG. 22 illustrates filming-forming models, and FIG. 23 is a view for comparing the number of particles on a wafer 200 in the current embodiment with the number of particles on a wafer 200 in the second embodiment. It can be understood that the number of particles increases if the process temperature is set to 20° C. The reason for this is solidification of a pyridine salt (reaction byproduct) caused by the low process temperature of 20° C.

Fifth Embodiment

In the above-described first to fourth embodiments, a silicon oxide film is formed on a wafer 200 as an example of a metal thin film. In the current embodiment, an explanation will be given on the case where a silicon nitride film is formed on a wafer 200. The current embodiment is the same as the second embodiment except that a nitriding gas is used as a modification gas to form a silicon nitride film. Thus, a detailed description of the current embodiment will be omitted.

In the current embodiment, $NH_3$ is used as a nitriding gas to form silicon nitride film instead of a silicon oxide film. By supplying pyridine used as a catalyst together with a silicon-containing gas, and an oxidizing gas together with pyridine, a silicon nitride film can be formed at a low temperature.

In addition, other nitrogen (N)-containing gases having a NH bond can be used as a nitriding gas. For example, $N_2H_4$, $(CH_3)N_2H_3$, or $(CH_3)N_2H_2$ may be selected as a nitriding gas.

In the first to fifth embodiments, a source gas or a modification gas, and a catalyst are simultaneously supplied for the same time period. However, they may be supplied at different times as long as a wafer 200 can be exposed to a mixture of the source gas or the modification gas and the catalyst. That is, for example, a catalyst may be supplied to a process chamber where a source gas or a modification gas is previously supplied, or a source gas or a modification gas may be supplied to a process chamber where a catalyst is previously supplied. Furthermore, in a state where a source gas or a modification gas and a catalyst are being supplied, the supply of the source gas or the modification gas may be first interrupted, and after a predetermined time, the supply of the catalyst may be interrupted. Alternatively, in that state, the supply of the catalyst may be first interrupted, and after a predetermined time, the supply of the source gas or the modification gas may be interrupted.

When a source gas or a modification gas is supplied together with or simultaneously with a catalyst, the source gas or the modification gas and the catalyst may be supplied in a mixed state for only at least a predetermined time, and supplies of the source gas or modification gas and the catalyst may be stared at the same time or different times and be interrupted at the same time or different times. Furthermore, an exposure-to-source-gas process for exposing a substrate to a source gas, an exposure-to-modification-gas process for exposing the substrate to an oxidizing gas or a nitriding gas, and an exposure-to-catalyst process for exposing the substrate to a catalyst may be performed as follows. The exposure-to-source-gas process and the exposure-to-catalyst process, or the exposure-to-modification-gas process and the exposure-to-catalyst process may be simultaneously performed in a manner such that the substrate can be exposed to a mixture of the gas and the catalyst for only a predetermined time. That is, the processes may be starred at the same time or different times and be terminated at the same time or different times.

In the first to fifth embodiments, a silicon oxide film or a silicon nitride film is formed on a wafer 200 by using a silicon-containing gas (metal-containing substance) as a thin film forming source gas. However, other metal-containing substances can be used instead of a silicon-containing gas. For example, a substance containing a group 4 element and a group 14 element, germanium (Ge), hafnium (Hf), zirconium (Zr), titanium (Ti), or gallium (Ga) may be used for obtaining the same effect. A compound may be used, which contains any one of the above-mentioned elements in combination with the other elements which are the same as those of a compound mentioned as a silicon-containing gas in the first embodiment.

By using such a metal-containing substance and a catalyst, a film such as a silicon oxide (SiO) film, a germanium oxide (GeO) film, a titanium oxide (TiO) film, a zirconium oxide (ZrO) film, a hafnium oxide (HfO) film, a gallium oxide (GaO) film, a silicon nitride (SiN) film, a germanium nitride (GeN) film, a titanium nitride (TiN) film, a zirconium nitride (ZrN) film, a hafnium nitride (HfN) film, or a gallium nitride (GaN) film can be formed on a wafer 200 at a low temperature.

According to the present invention, when an oxide or nitride film is formed on a substrate placed in the process chamber by exposing the substrate to a source gas, one of an oxidizing gas and a nitriding gas, and a catalyst, since a substance selected as the catalyst has acid dissociation constant $pK_a$ in the range from 5 to 7, the oxide or nitride film can be formed on the substrate at a low temperature.

[Supplementary Note]

The present invention also includes the following preferred embodiments.

(Supplementary Note 1)

According to an embodiment of the present invention, there is provided a semiconductor device manufacturing method for forming an oxide or nitride film on a substrate, the semiconductor device manufacturing method comprising: exposing the substrate to a source gas; exposing the substrate to a modification gas comprising an oxidizing gas or a nitriding gas, wherein an atom has electronegativity different from that of another atom in molecules of the oxidizing gas or the nitriding gas; and exposing the substrate to a catalyst, wherein the catalyst has acid dissociation constant $pK_a$ in a range from 5 to 7, but a pyridine is not used as the catalyst.

(Supplementary Note 2)

Preferably, the exposing of the substrate to the source gas and the exposing of the substrate to the catalyst may be simultaneously performed, and the exposing of the substrate to the modification gas and the exposing of the substrate to the catalyst may be simultaneously performed.

(Supplementary Note 3)

Preferably, the semiconductor device manufacturing method may further comprise removing the source gas, the oxidizing gas, or the nitriding gas that remains, wherein the substrate may be exposed to the source gas, the oxidizing gas, or the nitriding gas in a state where the source gas and the oxidizing gas or the nitriding gas are not mixed with each other.

(Supplementary Note 4)

Preferably, the catalyst may be a heterocyclic compound comprising nitrogen (N).

(Supplementary Note 5)

Preferably, the catalyst may be one of aminopyridine, picoline, piperazine, and lutidine.

(Supplementary Note 6)

Preferably, the source gas may be a compound comprising one or more of group 4 elements or group 14 elements.

(Supplementary Note 7)

Preferably, the source gas may be a compound comprising one or more of silicon (Si), germanium (Ge), titanium (Ti), zirconium (Zr), hafnium (Hf), and gallium (Ga).

(Supplementary Note 8)

Preferably, the oxidizing gas may be a substance having OH bonds, and the nitriding gas may be a substance having NH bonds.

(Supplementary Note 9)

Preferably, the oxidizing gas may comprise one or more of $H_2O$, $H_2O_2$, plasma of a mixture of $H_2$ and $O_2$, $O_2$ plasma, $H_2$, and $O_3$.

(Supplementary Note 10)

Preferably, the oxide or nitride film formed on the substrate may be one or a compound of a silicon oxide (SiO) film, a germanium oxide (GeO) film, a titanium oxide (TiO) film, a zirconium oxide (ZrO) film, a hafnium oxide (HfO) film, a gallium oxide (GaO) film, a silicon nitride (SiN) film, a germanium nitride (GeN) film, a titanium nitride (TiN) film, a zirconium nitride (ZrN) film, a hafnium nitride (HfN) film, and a gallium nitride (GaN) film.

(Supplementary Note 11)

Preferably, the source gas may be a compound comprising a group 17 element.

(Supplementary Note 12)

Preferably, the source gas may be a compound comprising one or more of chlorine (Cl), fluorine (F), bromine (Br), and iodine (I).

(Supplementary Note 13)

According to another embodiment of the present invention, there is provided a semiconductor device manufacturing method comprising: exposing a substrate placed in a process chamber to a source gas; exposing the substrate placed in the process chamber to a modification gas comprising an oxidizing gas or a nitriding gas, wherein an atom has electronegativity different from that of another atom in molecules of the oxidizing gas or the nitriding gas; and exposing the substrate placed in the process chamber to a catalyst, wherein the exposing of the substrate to the source gas, the exposing of the substrate to the modification gas, and the exposing of the substrate to the catalyst are performed while heating the substrate, so as to form an oxide or nitride film on the substrate, wherein in the exposing of the substrate to the catalyst, the process chamber is kept at a pressure lower than a vapor pressure of a byproduct corresponding to a surface temperature of the substrate, the byproduct being produced by a reaction between the catalyst and the source gas and starting to sublimate at the vapor pressure, wherein the sublimated byproduct is exhausted to an outside area of the process chamber.

(Supplementary Note 14)

Preferably, the process chamber may be kept at a temperature equal to or lower than 200° C.

(Supplementary Note 15)

Preferably, the process chamber may be kept at about 100° C.

(Supplementary Note 16)

Preferably, the exposing of the substrate to the source gas and the exposing of the substrate to the catalyst may be simultaneously performed, and the exposing of the substrate to the modification gas and the exposing of the substrate to the catalyst may be simultaneously performed, so as to form the oxide or nitride film on the substrate.

(Supplementary Note 17)

Preferably, the semiconductor device manufacturing method may further comprise removing an atmosphere from the process chamber, wherein the substrate placed in the process chamber is exposed to the source gas, the oxidizing gas, or the nitriding gas in a state where the source gas and the oxidizing gas or the nitriding gas are not mixed with each other.

(Supplementary Note 18)

According to another embodiment of the present invention, there is provided a substrate processing apparatus comprising: a process chamber configured to accommodate a substrate; a first gas supply system configured to supply a source gas to the process chamber; a second gas supply system configured to supply at least one of an oxidizing gas and a nitriding gas to the process chamber, wherein an atom has electronegativity different from that of another atom in molecules of the oxidizing gas and the nitriding gas; a third gas supply system configured to supply a catalyst to the process chamber, wherein the catalyst has acid dissociation constant $pK_a$ in a range from about 5 to about 7 but a pyridine is not used as the catalyst; and a control unit configured to control the first to third gas supply systems, wherein the control unit controls the first to third gas supply systems to expose a surface of the substrate to a mixture of the source gas and the catalyst and then to a mixture of the catalyst and at least one of the oxidizing gas and the nitriding gas, so as to form a oxide or nitride film on the substrate.

(Supplementary Note 19) According to another embodiment of the present invention, there is provided a substrate processing apparatus comprising: a process chamber configured to accommodate a substrate; a heating system configured to heat the substrate to a predetermined process temperature; a first gas supply system configured to supply a source gas to the process chamber; a second gas supply system configured to supply at least one of an oxidizing gas and a nitriding gas to the process chamber, wherein an atom has electronegativity different from that of another atom in molecules of the oxidizing gas and the nitriding gas; a third gas supply system configured to supply a catalyst to the process chamber; and a control unit configured to control the heating system and the first to third gas supply systems, wherein so as to form an oxide or nitride film on the substrate, the control unit controls the heating system and the first to third gas supply systems so as to heat the substrate to a predetermined process temperature and expose a surface of the substrate to a mixture of the source gas and the catalyst and then to a mixture of the catalyst and at least one of the oxidizing gas and the nitriding gas while keeping the process chamber at a pressure lower than a vapor pressure of a byproduct corresponding to a surface temperature of the substrate, the byproduct being produced by a reaction between the catalyst and the source gas and starting to sublimate at the vapor pressure.

(Supplementary Note 20)

According to another embodiment of the present invention, there is provided a semiconductor device on which an oxide or nitride film is formed by: exposing the substrate to a source gas; exposing the substrate to a modification gas comprising an oxidizing gas or a nitriding gas; and exposing the substrate to a catalyst, wherein an atom has electronegativity different from that of another atom in molecules of the oxidizing gas or the nitriding gas, and the catalyst has acid dissociation constant $pK_a$ in a range from 5 to 7 but a pyridine is not used as the catalyst.

(Supplementary Note 21)

According to another embodiment of the present invention, there is provided a semiconductor device manufacturing method for forming an oxide or nitride film on a substrate, the semiconductor device manufacturing method comprising: exposing the substrate to the source gas; exposing the substrate to a modification gas comprising an oxidizing gas or a nitriding gas, wherein an atom has electronegativity different from that of another atom in molecules of the oxidizing gas or the nitriding gas; and exposing the substrate to a catalyst, wherein the catalyst has acid dissociation constant $pK_a$ in an allowable range.

(Supplementary Note 22)

According to another embodiment of the present invention, there is provided a semiconductor device manufacturing method comprising: a first process of exposing a substrate placed in a process chamber to a source gas and a catalyst; a second process of exhausting an inside atmosphere of the process chamber; a third process of exposing the substrate to an oxidizing gas or a nitriding gas and a catalyst, wherein an atom has electronegativity different from that of another atom in molecules of the oxidizing gas or the nitriding gas; and a fourth process of exhausting the inside atmosphere of the process chamber, wherein the first to fourth processes are sequentially performed to form an oxide or nitride film on the substrate, and a catalyst having acid dissociation constant $pK_a$ in a range from 5 to 7 but not pyridine is used in the second process and the fourth process.

Although a vertical batch type apparatus is described, the present invention is not limited thereto. For example, the present invention can be applied to a single-wafer type apparatus and a horizontal type apparatus.

In addition, according to the present invention, since a film can be formed at a low temperature at which photoresist is not damaged, the present invention can be applied to a lithography double patterning method in which a photoresist pattern is formed by repeating a patterning process twice or more.

What is claimed is:

1. A semiconductor device manufacturing method comprising:
   exposing a substrate placed in a process chamber to a source gas;
   stopping an exposure of the substrate to the source gas and purging the source gas;
   exposing the substrate to a catalyst and a modification gas comprising an oxidizing gas or a nitriding gas, wherein an atom has electronegativity different from that of another atom in molecules of the oxidizing gas or the nitriding gas; and stopping an exposure of the substrate to the catalyst and the modification gas, and purging the catalyst and the modification gas, wherein the exposure of the substrate to the source gas and the exposure of the substrate to the catalyst and the modification gas are performed while heating the substrate, so as to form an oxide or nitride film on the substrate, and wherein the process chamber is kept at a pressure lower than a vapor pressure of a byproduct corresponding to a surface temperature of the substrate during the exposure of the substrate to the catalyst and the modification gas, the byproduct being produced by a reaction between the catalyst and the source gas and starting to sublimate at the vapor pressure.

2. The semiconductor device manufacturing method of claim 1, wherein the process chamber is kept at a temperature equal to or lower than 200° C.

3. The semiconductor device manufacturing method of claim 2, wherein the process chamber is kept at about 100° C.

4. The semiconductor device manufacturing method of claim 1, wherein an acid dissociation constant pKa of the catalyst exclusive of pyridine ranges from 5 to 7.

5. The semiconductor device manufacturing method of claim 1, wherein the catalyst is supplied to the substrate simultaneously with the source gas during the exposure of the substrate to the source gas.

* * * * *